United States Patent
Paulsen et al.

(10) Patent No.: US 10,671,348 B2
(45) Date of Patent: Jun. 2, 2020

(54) CHARGE-SCALING MULTIPLIER CIRCUIT WITH DUAL SCALED CAPACITOR SETS

(71) Applicant: International Business Machines Corporation, Armonk, NY (US)

(72) Inventors: David Paulsen, Inver Grove Heights, MN (US); Phil Paone, Rochester, MN (US); George Paulik, Rochester, MN (US); John E. Sheets, II, Zumbrota, MN (US); Karl Erickson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 16/162,437

(22) Filed: Oct. 17, 2018

(65) Prior Publication Data

US 2020/0125328 A1   Apr. 23, 2020

(51) Int. Cl.
*G06F 7/487* (2006.01)
*H03M 1/46* (2006.01)

(52) U.S. Cl.
CPC ............ *G06F 7/4876* (2013.01); *H03M 1/46* (2013.01)

(58) Field of Classification Search
CPC .............................. G06F 7/4876; H03M 1/46
USPC ........................................................ 708/625
See application file for complete search history.

(56) References Cited

U.S. PATENT DOCUMENTS

| | | | |
|---|---|---|---|
| 7,116,255 B2 | 10/2006 | Lee et al. | |
| 7,157,889 B2 | 1/2007 | Kerhahan et al. | |
| 7,855,667 B2 | 12/2010 | Tsukamoto | |
| 9,411,554 B1 | 8/2016 | Young et al. | |
| 2004/0169551 A1 | 9/2004 | Palaskas et al. | |
| 2018/0292851 A1 | 10/2018 | Mahajan et al. | |

FOREIGN PATENT DOCUMENTS

| | | |
|---|---|---|
| DE | 10319562 B3 | 11/2004 |
| IN | 263MUM2005 A | 4/2007 |

OTHER PUBLICATIONS

Unknown, "EE247—Lecture 14", Data Converters—DAC Design, 2009, 34 pages.
Paulsen et al., "Charge-Scaling Multiplier Circuit", U.S. Appl. No. 16/162,431, filed Oct. 17, 2018.
Paulsen et al., "Charge-Scaling Multiplier Circuit With Digital-to-Analog Converter", U.S. Appl. No. 16/162,435, filed Oct. 17, 2018.

(Continued)

*Primary Examiner* — Tan V Mai
(74) *Attorney, Agent, or Firm* — Nathan M. Rau

(57) ABSTRACT

A multiplier circuit can be fabricated within an integrated circuit and can draw a product output node to a voltage proportional to a product of first and second binary numbers received at two sets of inputs. The multiplier circuit includes a first set of scaled capacitors connected to an output of a multiplexor and to a local product output node. Each multiplexor is connected to a second set of scaled capacitors configured to generate an analog voltage in proportion to the value of the first binary number. Each scaled capacitor of first set of scaled capacitors has a capacitance proportional to a significance of a respective bit of the second binary number. The multiplier circuit includes a reference capacitor connected to ground and the product output node, and a reset circuit configured to draw, in response to a RESET signal, the product output node to ground.

20 Claims, 11 Drawing Sheets

(56) References Cited

OTHER PUBLICATIONS

IBM, List of IBM Patents or Patent Applications Treated as Related, Oct. 16, 2018, 2 pages.
Paulsen et al., "Charge-Scaling Adder Circuit", U.S. Appl. No. 16/018,108, filed Jun. 26, 2018.
Paulsen et al., "Charge-Scaling Subtractor Circuit", U.S. Appl. No. 16/018,113, filed Jun. 26, 2018.

CHARGE-SCALING MULTIPLIER CIRCUIT WITH DUAL SCALED CAPACITOR SETS

BACKGROUND

The present disclosure generally relates to integrated circuits (ICs). In particular, this disclosure relates to a charge-scaling multiplier circuit used to perform rapid multiplication operations on binary numbers within an IC.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs may include analog, digital and "mixed signal" chips, i.e., chips that incorporate both analog and digital functions on the same silicon die.

A capacitor is a passive electrical component having at least two electrical conductors known as plates, separated by a dielectric or insulator, and which may be used to electrostatically store energy in an electric field. Capacitors may be useful as circuit elements in conjunction with a variety of types of electronic devices such as digital and analog ICs.

SUMMARY

Embodiments may be directed towards a multiplier circuit fabricated within an integrated circuit (IC). The multiplier circuit is configured to draw a product output node to a voltage proportional to a product of two received N-bit binary numbers. The multiplier circuit includes a first set of N inputs configured to receive a first N-bit binary number, each input of the first set of N inputs indexed by an integer bit number "n" corresponding to each input's respective significance, where n is in a range between and including 0 and N−1. The multiplier circuit also includes a second set of N inputs configured to receive a second N-bit binary number, each input of the second set of N inputs indexed by the integer bit number "n" corresponding to each input's respective significance. The multiplier circuit also includes a local reset device configured to draw, in response to receiving a reset signal, a local product node to ground. The multiplier circuit also includes a first set of N scaled capacitors, each capacitor of the first set of N scaled capacitors electrically connected to a respective input of the first set of N inputs, and further electrically connected to a scaled node, each capacitor of the first set of N scaled capacitors having a capacitance value equal to $2^n*$a unit capacitance value ($C_{UNIT}$). The multiplier circuit also includes a first reference capacitor electrically connected to GND and further electrically connected to the scaled node, a value of the reference capacitor equal to $C_{UNIT}$. The multiplier circuit also includes a set of N analog muxes, each analog mux of the set of N analog muxes configured to drive, in response to a respective input of the second set of N inputs, to a corresponding analog mux output node, a voltage equivalent to a voltage on the scaled node. The multiplier circuit also includes a second set of N scaled capacitors, each capacitor of the second set of N scaled capacitors electrically connected to a respective analog mux output node and further electrically connected to the local product node, each capacitor of the second set of N scaled capacitors having a capacitance value equal to $2^n*C_{UNIT}$. The multiplier circuit also includes a second reference capacitor electrically connected to GND and further electrically connected to the local product node, a value of the reference capacitor equal to $C_{UNIT}$. The multiplier circuit also includes a unity gain amplifier configured to drive the product output node to a voltage equivalent to a voltage on the local product node.

Embodiments may also be directed towards a method of operating a multiplier circuit that uses charge-scaling to multiply a first N-bit binary number by a second N-bit binary number. The multiplier circuit is fabricated within an integrated circuit (IC). The method includes resetting the multiplier circuit by drawing to ground, with a local reset device of the multiplier circuit, a local product node of the multiplier circuit. The method also includes receiving, with a first set of N inputs of the multiplier circuit, a first N-bit binary number. The method also includes receiving, with a second set of N inputs of the multiplier circuit, a second N-bit binary number. The method also includes generating, with a first set of scaling capacitors and in response to a value of first N-bit binary number, at a scaled node, a scaled voltage that represents the value of the first N-bit binary number. The method also includes selecting, in accordance with a respective input of the second set of N inputs applied to each analog mux of a set of N analog muxes, the scaled voltage to be applied to respective scaling capacitors of a second set of scaling capacitors electrically connected to respective analog mux output nodes. The method also includes scaling, with the respective scaling capacitors of the second set of scaling capacitors, the scaled voltage to produce, on the local product node of the multiplier circuit, a product output voltage representing a product of the first N-bit binary number and the N-bit second binary number. The method also includes driving, with a unity gain amplifier electrically connected to the local product node, a product output node to the product output voltage.

Embodiments may also be directed towards a design structure embodied on a non-transitory computer-readable storage medium readable by a machine used in design, manufacture, and simulation of a multiplier circuit fabricated within an integrated circuit (IC). The multiplier circuit is configured to draw a product output node to a voltage proportional to a product of two received N-bit binary numbers. The design structure includes elements that, when processed in a semiconductor manufacturing facility, produce an IC. The multiplier circuit includes a first set of N inputs configured to receive a first N-bit binary number, each input of the first set of N inputs indexed by an integer bit number "n" corresponding to each input's respective significance, where n is in a range between and including 0 and N−1. The multiplier circuit also includes a second set of N inputs configured to receive a second N-bit binary number, each input of the second set of N inputs indexed by the integer bit number "n" corresponding to each input's respective significance. The multiplier circuit also includes a local reset device configured to draw, in response to receiving a reset signal, a local product node to ground. The multiplier circuit also includes a first set of N scaled capacitors, each capacitor of the first set of N scaled capacitors electrically connected to a respective input of the first set of N inputs, and further electrically connected to a scaled node, each capacitor of the first set of N scaled capacitors having a capacitance value equal to $2^n$*a unit capacitance value ($C_{UNIT}$). The multiplier circuit also includes a first reference capacitor electrically connected to GND and further electrically connected to the scaled node, a value of the reference capacitor equal to $C_{UNIT}$. The multiplier circuit also includes a set of N analog muxes, each analog mux of the set of N analog muxes configured to drive, in response to a respective input of the second set of N inputs, to a corresponding analog mux output node, a voltage equivalent to a voltage on the scaled node. The multiplier circuit also includes a second set of N scaled capacitors, each capacitor of the second set of N scaled capacitors electrically connected to a respective analog mux output node and further electrically connected to the local product node, each capacitor of the second set of N scaled capacitors having a capacitance value equal to $2^n C_{UNIT}$. The multiplier circuit also includes a second reference capacitor electrically connected to GND and further electrically connected to the local product node, a value of the reference capacitor equal to $C_{UNIT}$. The multiplier circuit also includes a unity gain amplifier configured to drive the product output node to a voltage equivalent to a voltage on the local product node.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
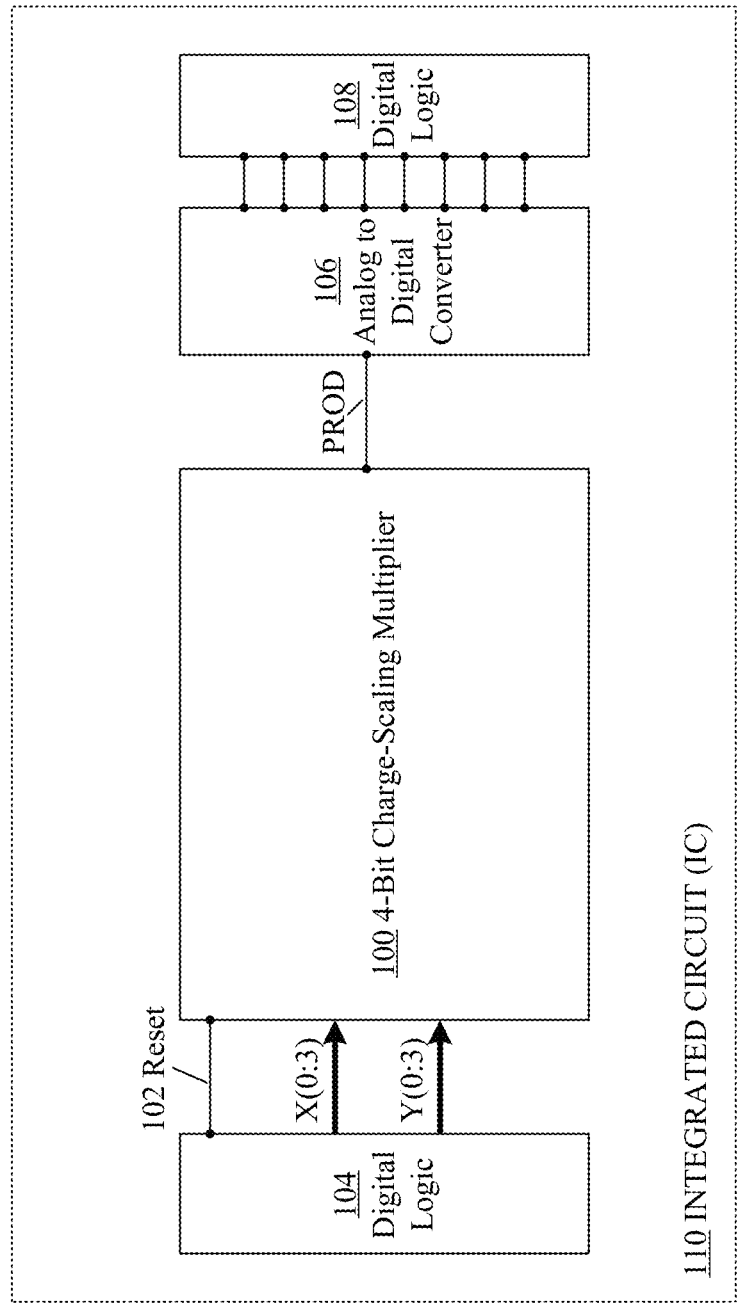
FIG. 1 includes a block diagram depicting a 4-bit charge-scaling multiplier circuit within an integrated circuit (IC), according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing, through the use of a charge-scaling multiplier circuit, rapid multiplication of binary numbers, for electronic equipment such as processor integrated circuits (ICs). Such processor ICs may be used to provide computational capabilities to electronic equipment such as servers. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing rapid multiplication of binary numbers for ICs used in electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing rapid multiplication of binary numbers for ICs used in consumer and small office/home office (SOHO) electronic equipment such as personal computers, laptops, mobile and network server devices.

Individual bits of multi-bit binary numbers, corresponding input and output signal names, circuit nodes, and associated scaled capacitors described herein can each be identified with a reference label including a signal name followed by a bit number. For example, a reference label "X0" denotes a signal name of "X" and a bit number of "0". The least-significant bit of a multi-bit binary number is referred to with a bit number of "0", e.g., "X0." Larger bit numbers are used to denote bits of higher significance in multi-bit binary numbers herein. Using, as an example, a three-bit binary number "X" that includes bits "0," "1" and "2," i.e., X0:X3, X0 is the least-significant, or lowest order, bit and X3 is the most-significant, or highest order, bit. For ease of discussion, in the case of a binary number having an arbitrary or unknown number of bits, the most-significant bit of such a number may be referred to herein as the "$n^{th}$" bit.

For ease of discussion a single reference label, e.g., "X3", may be used in conjunction with multiple descriptors to identify various entities and elements depicted in the figures and discussed in the Specification. For example, terms such as "input X3" and "bit X3" may each be understood to refer to various entities and items related to the X3 bit of a binary number input to a multiplier circuit.

Various aspects of the present disclosure may be useful for providing rapid multiplication capability and high-throughput computational capabilities to an IC and/or processor circuit for applications where limited numerical precision may be acceptable. Embodiments of the present disclosure can result in reductions in IC area and operating power required to implement multiplier circuits such as charge-scaling multipliers. Such embodiments may be implemented through the use of existing and proven IC technologies, design tools, methodologies and fabrication techniques.

Certain classes of emerging and rapidly growing computer-based "data-centric" applications can both process, e.g., perform calculations on, and generate vast, unprecedented volumes of data in the course of pursuing a solution/answer to particular problems. Such classes of applications can, for example, start with a model and a set of initial conditions and can generate very large volumes of data on route to a solution, or can begin with vast datasets and seek succinct explanations for them.

"Data-centric" application classes can generally include, for example, machine learning (ML) and deep-learning problems/projects, artificial intelligence (AI) and logical inference applications, data mining, real-time high-throughput data analysis and neural networks. Particular application types within these classes can include genomics, nuclear physics simulations, seismology predictions, climate science and medical research. These classes and types of data-centric applications can be designed to make decisions and perform further sets of calculations based on the results of calculations performed on the vast amounts of data.

Existing hardware functions and corresponding software used to perform calculations on the vast amounts of data can include generally high-precision arithmetic operations and corresponding data formats, for example, 64-bit, double-precision or floating-point additions, subtractions and multiplications, as commonly used in scientific modeling applications. While such arithmetic operations can be used to process large amounts of data, the high degree of precision inherent in such operations is frequently not critical to subsequent tasks of making decisions based upon computational results, or performing further computations on the data. Decision-making and subsequent calculations for data-centric applications can frequently be successfully performed on data values having limited or lower precision than data produced by double-precision or floating-point operations, with no change or compromise to the end results of the computations.

Such limited-precision arithmetic operations can be performed by a variety of computing hardware systems, for example, a general-purpose computing system, a server, a supercomputer or high-performance computer (HPC) that is specially designed for a particular application. These systems can include, for example, ICs and software which can selectively employ a variety of types of binary arithmetic hardware functions and associated software integrated to access the hardware functions. Such a computing scheme can be known as a "mixed-precision" computing environment, due to the variety of numerical precisions which may be employed for particular computations. Mixed-precision computing environments can include, for example both high-precision, e.g., 64-bit, double-precision or floating-point multiplication operations alongside relatively low-precision operations such as 16-bit, or half-precision floating-point arithmetic and integer arithmetic operations. Such mixed-precision computing environments can produce enhanced computational efficiency and throughput when employed to host data-centric computing applications.

Certain other types of applications which process data at high throughput rates may not require high-precision calculations, and can thus benefit from the use of high-speed, limited-precision arithmetic functions. Such applications can include, for example, digital audio and video signal processing, where processing speed may be of significantly greater importance than absolute accuracy. For example, slight arithmetic inaccuracies in audio or video editing, rendering and playback functions may not be noticeable to an end-user of such applications. Other types of applications which may benefit from high-speed, limited-precision arithmetic operations can include real-time data processing applications such as inventory control or stock-trading applications, where the rate at which data can be processed takes precedence over the absolute accuracy of such data. In many such applications, access to, and processing of, real-time data may be substantially more important to subsequent decision-making than is the absolute accuracy of such data.

Embodiments of the present disclosure can be useful for providing high-speed, limited-precision numerical multiplication capability to an IC and/or processor circuit. Such an IC or processor circuit can be integrated into a wide variety of mixed-precision computational systems such as general-purpose computing systems, servers, supercomputers or HPCs. The integration of embodiments within such computational systems can result in significant acceleration of certain arithmetic operations when compared to existing implementation of these arithmetic operations on hardware employing only binary signal values and corresponding devices. Additionally, embodiments can provide for significantly reduced hardware power consumption and IC layout area required for arithmetic function implementation. Computational systems implemented with embodiments can experience significant increases in computational throughput capability, which can result in accelerated completion of computational tasks, and an ability to perform vast computational tasks which may have been previously impractical to perform.

Certain embodiments relate to providing, through the use of a charge-scaling multiplier circuit, rapid multiplication of binary numbers. FIG. 1 includes a block diagram depicting a 4-bit charge-scaling multiplier circuit 100 fabricated within an IC 110, according to embodiments of the present disclosure. In embodiments, IC 110 can also include digital logic 104, analog-to-digital converter 106 and digital logic 108, which can each be used in conjunction with the charge-scaling multiplier 100. In embodiments, the charge-scaling multiplier circuit 100 can be configured to provide rapid multiplication of received binary numbers for ICs such as central processing units (CPUs), graphics processing units (GPUs), application-specific integrated circuits (ASICs), and special-purpose ICs. A charge-scaling multiplier 100 as depicted in FIG. 1 can be fabricated with a wide variety of IC technologies and associated design methodologies, including, but not limited to, complementary metal-oxide semiconductor (CMOS), silicon on insulator (SOI), gallium arsenide (GaAs) and silicon-germanium (SiGe) IC technologies.

FIG. 1 and the associated discussion herein can be particularly useful in providing a general understanding of the operating principles, advantages and limitations of a charge-scaling multiplier circuit that is fabricated and operated within an IC 110. These operating principles, advantages and limitations are generally applicable to the various example charge-scaling multiplier circuits 300, 400, 500, 600, as depicted in FIGS. 3, 4, 5 and 6, respectively, and also to other embodiments not described within the present disclosure. It can be understood that the example charge-scaling multiplier circuits 300, 400, 500, 600 include particular features, operating characteristics, advantages and limitations of embodiments of the present disclosure that are generally consistent with the charge-scaling multiplier 100, FIG. 1.

Within the configuration depicted in FIG. 1, 4-bit charge-scaling multiplier 100 can receive binary numbers X and Y, and a RESET signal on reset input 102 from digital logic 104. Digital logic 104 can include, for example, a processor or processor core, a first-in, first-out (FIFO) memory device, a register or other circuit or function configured to supply binary numbers to the X and Y inputs of 4-bit charge-scaling multiplier 100. According to embodiments, digital logic 104 can be configured to supply an interleaved sequence of binary numbers, i.e., X and Y, and RESET signals to 4-bit charge-scaling multiplier 100.

In response to receiving input signals from digital logic 104, 4-bit charge-scaling multiplier 100 subsequently multiplies the binary number Y by the binary number X, and provides an analog output signal representing the product, i.e., X times Y at the PROD output node. This output signal can then be received by analog-to-digital converter (ADC) 106, which is electrically connected to the multiplier 100's PROD output node. Once ADC 106 has converted the value of the received product output signal to a binary number, the binary number can be received by digital logic 108. Digital logic 108 can include, for example, a processor or processor core, a FIFO memory device, register or other circuit or function configured to receive binary numbers from analog-to-digital converter 106.

ADC 106 can include converter types such as a flash ADC, a resistor-ladder ADC, a parallel comparator ADC, a successive-approximation ADC and a counter-type ADC. An IC designer may select a particular type of ADC in order to meet particular design criteria such as conversion speed, power usage, IC area consumption or an analog voltage input range. For example, according to embodiments, the analog output signal at the product output node PROD of 4-bit charge-scaling multiplier 100 can be in a range between GND (0 V) and a supply voltage $V_{DD}$. Accordingly, an ADC 106 can be chosen by an IC or circuit designer that can receive analog signals in such an input voltage range.

FIG. 1 illustrates a charge-scaling multiplier 100 configured to receive two 4-bit binary numbers X and Y and output a voltage that is an analog of the product of these binary numbers, which when converted to binary by ADC 106, includes 8 bits. This, however is not to be construed as limiting. It can be understood that, according to embodiments, the binary numbers input to such a multiplier can include a different number of bits, e.g., 2, 3, 5, etc., and that the corresponding product output can include a number of bits sufficient to represent the product of the two binary input numbers.

Figure 2:
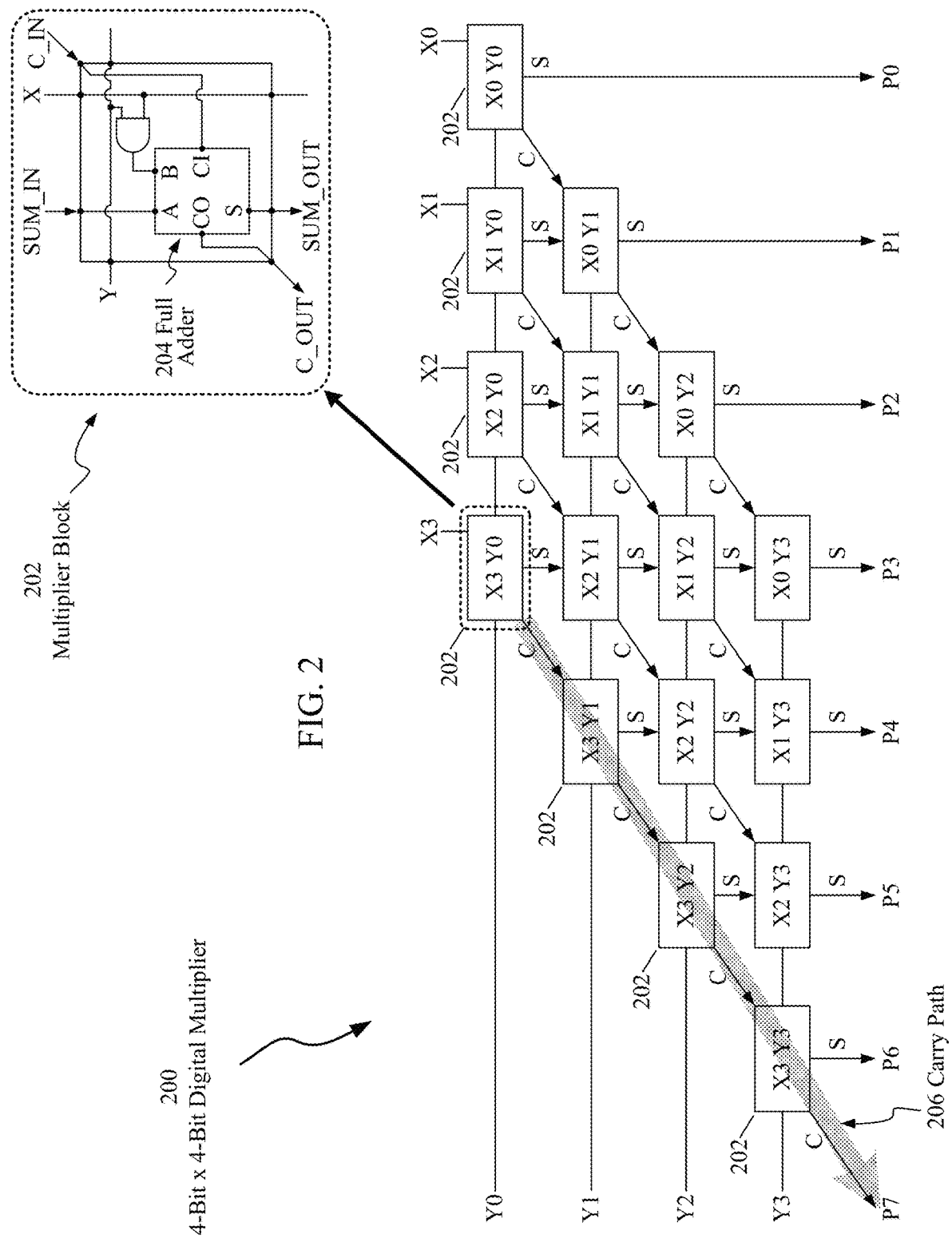
FIG. 2 is a schematic depiction of a 4-bit by 4-bit digital multiplier having a multiplier block including combinational logic.

According to embodiments, a multiplier such as 4-bit charge-scaling multiplier 100 can have significant performance, power consumption and IC area advantages over other types of multiplier circuits that employ only binary, i.e., logical "0" and "1," signal states and corresponding logic functions to represent and process numbers, as depicted, for example, in FIG. 2. It is contemplated that, in comparison to traditional binary multiplier circuits, a charge-scaling multiplier can be used to multiply binary numbers approximately 10× faster, consume approximately 10% of the power, and require approximately 10% of the area of traditional binary multiplier circuits.

Charge-scaling multiplier 100 includes two sets of "N" inputs, i.e., X(0:3) and Y(0:3), where N=4, that are configured to receive the 4-bit binary numbers X and Y, respectively. Each input or bit belonging to both X and Y is indexed by an integer bit number "n" corresponding to the bit's respective significance, where n is in a range between and including 0 and N−1, i.e., n=0, 1, 2, 3. For example, for the 4-bit binary number X, X0 is the least-significant bit, while X3 is the most-significant bit.

In some embodiments, the precision of multiplication operations performed with charge-scaling multiplier such as multiplier 100 may be limited. For example, a 4-bit charge-scaling multiplier may have a reduced or limited precision such that the voltage proportional to a product of received 4-bit binary numbers is within a range corresponding to +/−1 least-significant bit (LSB) of the received 4-bit binary numbers. Such an accuracy limit can result, for example, from factors such as dimensional and repeatability limitations of a particular semiconductor process. Dimensions of semiconductor structures used within the charge-scaling multiplier, e.g., scaled capacitors, may vary due to such semiconductor process limitations, which can result in the capacitance value of scaled capacitors deviating from a specified value. Such deviations can cause deviations in product output voltages from a specified value, which may result in incorrect translation of this voltage level by analog-to-digital converter 106 into a binary number representing the product.

In certain applications, the functional accuracy of a charge-scaling multiplier may be limited by the resolution of an ADC such as 106. By way of example, for a supply voltage $V_{DD}$ of 1.0 V, a particular ADC may only be able to accurately translate PROD output voltage steps of 4 mV or greater into binary numbers. In some cases, the accuracy of such an ADC may alternately be limited by a number of steps or divisions of the example supply voltage $V_{DD}$ of 1.0 V. For example, such an ADC may only be able to resolve 250 or fewer divisions of the example $V_{DD}$ of 1.0 V. In some embodiments, a smallest voltage increment of the voltage proportional to a product of received N-bit binary numbers can be greater than an operating voltage of an ADC divided by 250.

Certain computing systems and associated software applications may not require highly accurate mathematical operations and may be able to function successfully while using limited or reduced-precision operations such as multiplication, as can be provided by embodiments. Aspects of the present disclosure can be useful in performing multiplication of binary numbers at a significantly increased speed relative to traditional multiplier circuits and devices. Such increased computational speed can be particularly useful within computing systems and associated software applications requiring a great number of operations to be performed but where high-precision is not required. Such applications can include data-centric tasks such as AI, data mining, cognitive computing solutions and the like, and may be hosted on computing hardware platforms such as HPCs or supercomputers. Embodiments of the present disclosure can be easily integrated into ICs and other data-processing hardware used within such hardware platforms as HPCs or supercomputers.

Embodiments of the present disclosure can also be integrated effectively into computing hardware and systems designed to perform mixed-precision mathematical operations, in which trade-offs are dynamically made by the system between computational speed and computational accuracy. Embodiments can provide such a system with a particularly rapid and energy-efficient alternative to traditional binary computational hardware.

FIG. 2 is a schematic depiction of a 4-bit×4-bit digital multiplier 200 consisting of an electrically interconnected array of a multiplier blocks 202 that are each formed from combinational logic elements. FIG. 2 can be particularly useful in providing an understanding of the structure, function and associated input-to-output-delay of a traditional digital multiplier circuit.

In some IC applications, a 4-bit×4-bit digital multiplier 200 can be electrically interconnected within an IC to sections of digital logic consistent with digital logic 104 and digital logic 108, as depicted and described with reference to FIG. 1. In such applications, digital multiplier 200 can be used to generate products from received pairs of 4-bit numbers, consistent with the function of embodiments of the present disclosure, e.g., 100, FIGS. 1 and 300, FIG. 3.

Digital multiplier 200 includes an array of digital multiplier blocks 202 interconnected to produce a product P(0:7) by performing a multiplication operation on two 4-bit numbers X(0:3) and Y(0:3). In contrast to 4-bit charge-scaling multipliers e.g., 100, FIGS. 1 and 300, FIG. 3, digital multiplier 200 includes only digital logic elements designed to produce binary output signals in response to binary input signals. Unlike the 4-bit charge-scaling multipliers 100 and 300, digital multiplier 200 does not include circuitry designed to produce analog signals representing product values in response to received digital input signals representing binary numbers.

Digital multiplier 200 includes an array of digital multiplier blocks 202 arranged and interconnected to receive two 4-bit binary numbers X, i.e., X(0:3) and Y, i.e., Y(0:3), and to perform a series of additions in order to produce an 8-bit binary number P, i.e., P(0:7) representing the product of X and Y. Each multiplier block 202 includes inputs X, Y, SUM_IN, C_IN and outputs C_OUT and SUM_OUT. In the context of the present discussion, the X and Y inputs of each multiplier block 202 are used to receive individual bits of the 4-bit binary numbers X and Y, and the SUM_IN and C_IN inputs are used to receive a sum bit from another multiplier block 202, and a carry input bit from another less significant multiplier block 202. Each multiplier block 202 includes a full adder 204, an AND gate and interconnect wiring. The interconnect wiring is used to connect the X and Y inputs of the multiplier block 202 to the inputs of the AND gate, and the output of the AND gate to input B of the full adder 204. Interconnect wiring is also used to connect the SUM_IN and C_IN inputs of the multiplier block 202 to the A and CI inputs of the full adder 204, respectively. Interconnect wiring is also used to connect the CO and S outputs of the full adder 204 to the C_OUT and SUM_OUT outputs of the multiplier block 202, respectively. The full adder 204 is consistent with full adder circuits used within various digital ICs such as CPUs, GPUs, and the like.

Multiplier blocks 202 within each horizontal row of digital multiplier 200 are interconnected to receive a single bit of the 4-bit binary number Y, e.g., Y0, while individual multiplier blocks 202 within each horizontal row are connected to each receive individual bits of the 4-bit binary number X, e.g., X0, X1, X2 and X3. The names of individual X and Y bits received at the inputs to the AND gate within each multiplier block 202 are used as labels of the multiplier blocks 202 within the depiction of digital multiplier 200. For example, the topmost row includes, from left to right, multiplier blocks 202 having labels X3Y0, X2Y0, X1Y0 and X0Y0. Each multiplier block 202 is interconnected to receive a unique combination of one bit from binary number X and one bit from binary number Y.

The interconnection of the four multiplier blocks 202 within each horizontal row of the digital multiplier 200 and the interconnection to the X(0:3) and Y(0:3) inputs creates a row structure that can be used to generate a "copy" or "image" of the 4-bit number X at the outputs of the AND gates within the multiplier blocks 202 of that row. This "copy of X" within a row is created in response to the respective Y input bit, e.g., Y0, for the uppermost horizontal row, having a logical "1" value.

The SUM_IN and C_IN inputs of each multiplier block 202 within a row are interconnected to sum outputs SUM_OUT and carry outputs C_OUT of multiplier blocks 202 located above the row, and are used to receive corresponding values of the SUM_OUT and C_OUT signals. The interconnections between sum outputs SUM_OUT and sum inputs SUM_IN are labeled as "S" within the depiction of digital multiplier 200. Similarly, the interconnections between carry outputs C_OUT and carry inputs C_IN are labeled as "C" within the depiction of digital multiplier 200. The rightmost multiplier block 202 in each row corresponds to an LSB, i.e., X0, of the 4-bit number X(0:3). By way of example, an input X0 or an output SUM value of a logical "1" to or from the multiplier block 202 labeled "X0Y0" in the uppermost row corresponds to a value of $2^0=1$. Accordingly, a logical "1" value of bit P0 of the product P also corresponds to a value of $2^0=1$.

Progressing leftwards within the uppermost row, an input X1 or an output SUM value of a logical "1" to or from the multiplier block 202 labeled "X1Y0" corresponds to a value of $2^1=2$. The progression continues to the most-significant bit (MSB), corresponding to multiplier block 202 labeled "X3Y0," where a logical "1" value corresponds to a value of $2^3=8$. The above-described multiplier blocks 202 in the uppermost row of digital multiplier 200 correspond to the LSB, i.e., Y0, of the Y input. If the value of the Y0 bit is a logical "1," the inclusion of the "copy of X" within the product output P(0:7) involves generating the copy within the uppermost row, and adding it to subsequent generated copies of X by using multiplier blocks 202 located in rows below the topmost row.

Progressing to the second highest row of multiplier blocks 202, the value of a Y1 bit that is used, if it has a logical "1" value, to generate a "copy of X" is $2^1=2$. In order to accommodate this increase, i.e., doubling, of significance of the copy of X that can be generated by the second row of multiplier blocks 202, the multiplier blocks 202 of the second row are shifted left by one position relative to the uppermost row. This shifting of the bit positions of the "copy of X" which can be generated within the second row effectively doubles the value of the bits within the product output P, corresponding to the doubled value of Y1 relative to the value of Y0. Similarly, the multiplier blocks 202 in each successive row below the described rows are shifted left by one position relative to the row immediately above. Digital multiplier 200 is thus designed to receive 4-bit inputs X and Y, and subsequently and simultaneously generate, in response to Y bits having logical "1" values, horizontally offset "copies of X" within each successive row of multiplier blocks 202.

Once these copies of the X(0:3) input bits are generated within the multiplier blocks 202 of each row, the sums SUM_OUT are subsequently generated by each multiplier block 202 and are propagated downwards to either a multiplier block in the same column of a lower row, or to a bit of the product output P. Similarly, the carry outputs C_OUT are subsequently generated by each multiplier block 202 are propagated downwards and leftward to either a multiplier block in a column one position to the left in a lower row, or to a bit of the product output P.

Although the "copies of X" can be generated simultaneously within each of the rows, the successive generation of the sums SUM_OUT and carry outputs C_OUT for each of the multiplier blocks 202 can each require additional time to complete. In addition, the completion of the addition and carry output generation operations for each multiplier block 202 is contingent upon receiving completed SUM_OUT and C_OUT values from all interconnected multiplier block(s) 202 that are positioned above and/or to the right. This dependency of multiplier blocks 202 upon the results received from electrically interconnected blocks above and to the right can result in significant overall delay between the application of the binary numbers X and Y and the appearance of a complete and correct product output P. By way of example, the longest delay path through digital multiplier 200 is depicted as carry path 206.

In order for a correct bit value to appear at the MSB, i.e., P7 of the product output P, the generation of both SUM_OUT and C_OUT values for the multiplier block 202 labeled X3Y0 must occur, and the subsequent C_OUT values must be propagated through the multiplier blocks 202 labeled X3Y1, X3Y2 and X3Y3. This ripple of generated values through the C_OUT outputs can cause significant delay of digital multiplier 200. This propagation delay can limit the number of sets of binary number inputs X and Y which can be processed by digital multiplier 200 within a particular time period. Such delays can significantly limit the performance of a digital computer system tasked with performing a large number of multiplication operations. Multipliers such as 4-bit×4-bit digital multiplier 200 can also consume a relatively large amount of power and occupy a relatively large amount of area within an IC. Although levels of circuit complexity can be added to a digital multiplier circuit such digital multiplier 200, in order to increase the speed/efficiency or decrease the IC circuit area or power consumption, these benefits can generally not all be realized within the same circuit design. Embodiments of the present disclosure described herein can be particularly useful by providing multiplier circuits that have speed, area power consumption and complexity advantages over traditional digital multiplier circuits. In some embodiments these stated advantages may be achieved at the expense of a small amount of the precision of the product output.

FIGS. 3-6 depict a variety of non-limiting examples of a charge-scaling multiplier circuit, according to embodiments of the present disclosure. However charge-scaling multiplier circuits employing other circuit topologies not described herein and/or employing combinations of elements described herein may be contemplated, within the spirit and scope of the present disclosure.

Embodiments of the present disclosure depicted in FIGS. 3-6 include capacitors having reference labels indicating capacitance values such as "C," multiples of C, e.g., "4C," or fractions of C, e.g., "C/4." It can be understood that the capacitance value "C" denotes a "unit capacitance" or "$C_{UNIT}$" value. In the context of the present discussion, the terms "C" and "$C_{UNIT}$" may be used interchangeably.

In embodiments, the value of unit capacitance $C_{UNIT}$ can be chosen by an IC designer, in accordance with various design criteria and tradeoffs. For example, a $C_{UNIT}$ value can be chosen to be appreciably larger than individual or collective values of parasitic capacitors in a particular charge-sharing multiplier circuit or circuit technology. In some embodiments, a value of a reference capacitor, also referred to as "$C_{REF}$," can be equal to a $C_{UNIT}$ value. Choosing a $C_{UNIT}$ value that is appreciably larger than parasitic capacitors can be useful in enhancing the accuracy of an analog voltage produced by a capacitive voltage-divider circuit including a reference capacitor. By way of example, the unit capacitance $C_{UNIT}$ can be approximately 1 fF, for a 14 nm CMOS or SOI technology. Other $C_{UNIT}$ values may be chosen and used for charge-scaling multipliers fabricated in other IC technologies. In some embodiments, the $C_{UNIT}$ value can be specified to be in a range between 2× and 10× that of an input capacitance value of an ADC, e.g., ADC 106, FIG. 1, that is connected to the PROD output node of the charge-scaling multiplier.

A $C_{UNIT}$ value can also be chosen in order to minimize, manage, or optimize the total IC circuit area used for a charge-sharing multiplier circuit design. If the $C_{UNIT}$ value, and thus, the total IC circuit area allocated to capacitors becomes excessive, the total IC circuit area required to implement certain embodiments of the present disclosure may exceed a specified maximum circuit area.

FIGS. 3-6 illustrate charge-scaling multipliers 300, 400, 500 and 600, respectively, configured to receive two 4-bit binary numbers X and Y and output a voltage, at the PROD output node, that is an analog of the product of X and Y. However, this is not to be construed as limiting. It can be understood that, according to embodiments, the binary numbers input to such a multiplier can include a different number of bits, e.g., 2, 3, 5, etc., and that the corresponding product output can span a voltage range sufficient to represent the product of the two binary input numbers. In some applications, this analog output voltage can be converted to a binary, e.g., 8-bit, number by an ADC, e.g., 106, FIG. 1. According to embodiments, multipliers such as 4-bit charge-scaling multipliers 300, 400, 500 and 600 can have significant performance, power consumption and IC area advantages over other types of multiplier circuits that employ only binary, i.e., logical "0" and "1," signal states and devices to represent numbers and calculate products, as depicted, for example, in FIG. 2.

Figure 3:
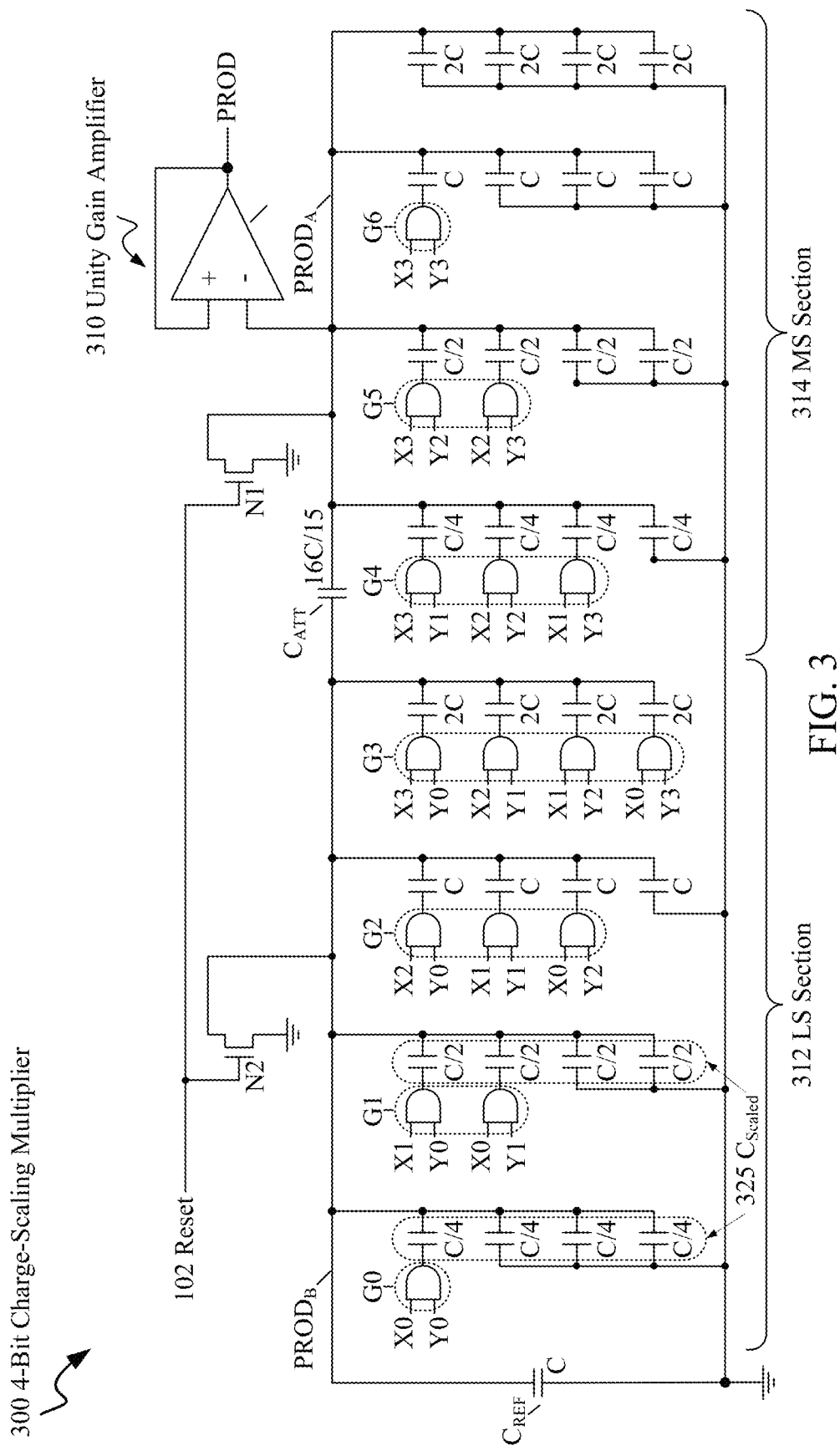
FIG. 3 is a schematic diagram depicting a 4-bit charge-scaling multiplier circuit, according to embodiments consistent with the figures.
Figure 7:
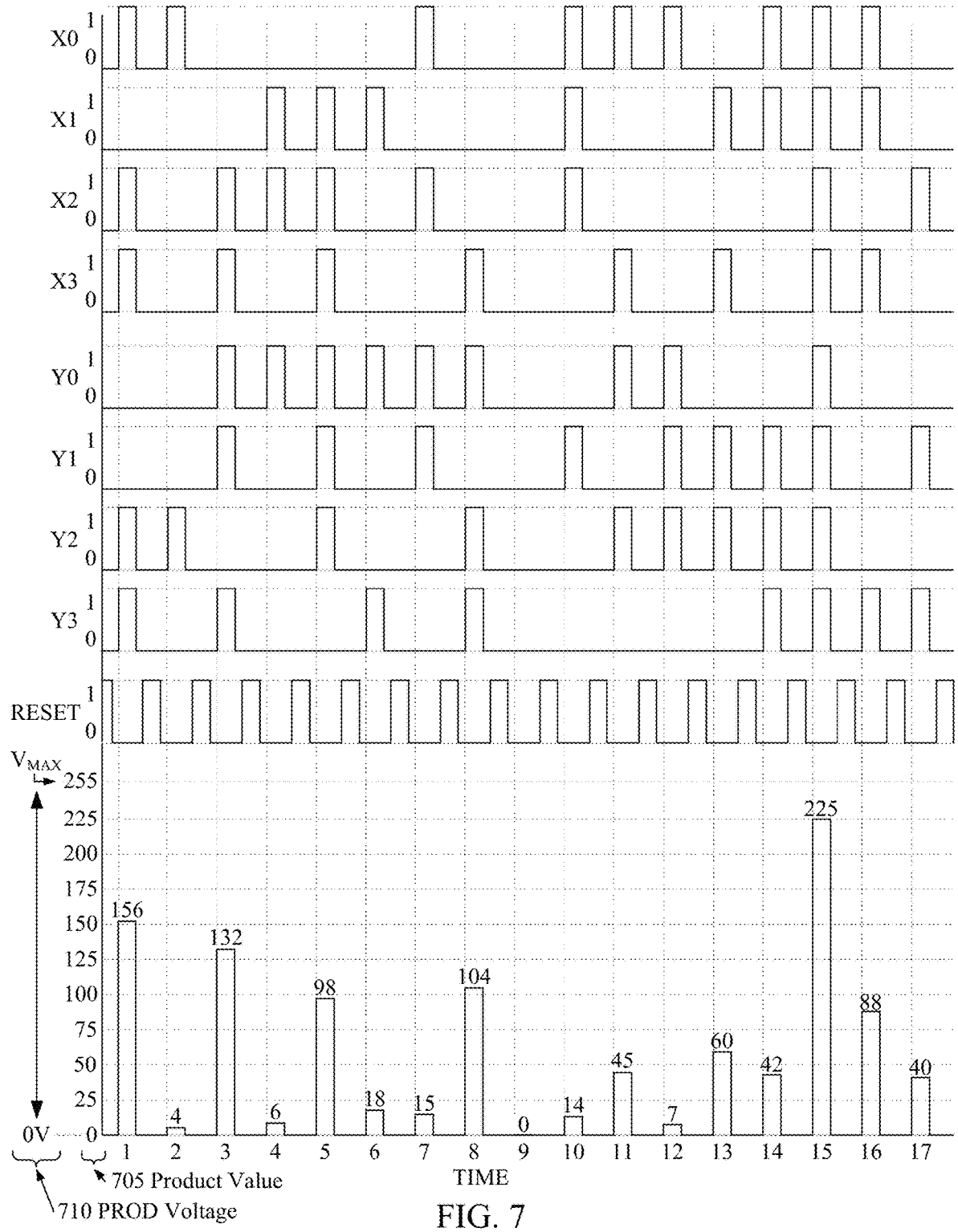
FIG. 7 is a waveform diagram depicting input and output waveforms of a 4-bit charge-scaling multiplier circuit, according to embodiments consistent with the figures.

FIG. 3 includes a schematic depiction of a 4-bit charge-scaling multiplier circuit 300 which can be fabricated within an IC 110, FIG. 1, according to embodiments generally consistent with the figures. Consistent with the configuration depicted in FIG. 1, the multiplier circuit 300 can also be electrically interconnected to digital logic 104, analog-to-digital converter 106 and digital logic 108 circuits, and can interact with these circuits in a manner consistent with charge-scaling multiplier 100, FIG. 1. For example, 4-bit charge-scaling multiplier 300 can receive binary numbers X and Y, and a RESET signal from digital logic 104, which can supply an interleaved sequence of binary numbers X and Y, and RESET signals to the multiplier 300. According to embodiments, the input signals, including X, Y and RESET, and the output PROD signal have consistent signaling levels, timing and protocol to those of multiplier circuit 100. The input and output waveforms of 4-bit charge-scaling multiplier circuit 300 are likewise consistent with the input and output waveforms of multiplier circuit 100, as depicted in FIG. 7. The charge-scaling multiplier circuit 300 can be useful in providing rapid multiplication of received binary numbers for various types of ICs that are fabricated with a wide variety of IC technologies and associated design methodologies.

Charge-scaling multiplier 300 includes two sets of "N" inputs, where N=4, i.e., X(0:3) and Y(0:3), configured to receive 4-bit binary numbers X and Y, respectively. Indexing of the X and Y inputs is consistent with indexing of similar X and Y inputs of 4-bit charge-scaling multiplier 100, FIG. 1.

4-bit charge-scaling multiplier 300 includes AND gates that are used to generate product terms which are subsequently summed in order to generate an analog output voltage representing a numerical product value. Each of the AND gates is electrically connected to receive a unique combination of one bit of the X input and one bit of the Y input, e.g., X0 and Y0. In embodiments, the output of each AND gate represents a product term of the two input bits received by the AND gate, e.g., X0-Y0. These product terms are subsequently scaled, according to their significance, by a set of scaled capacitors ($C_{Scaled}$) 325, in conjunction with a reference capacitor ($C_{REF}$) and an attenuation capacitor ($C_{ATT}$). According to embodiments, the scaling and simultaneous addition of the product terms is used to generate a product output voltage on the PROD output node that represents the product of the binary numbers received on the X and Y inputs.

For ease of illustration and referencing, in accordance with the unique combination of X and Y input bits received by each AND gate, each AND gate depicted in FIG. 3 will be referred to herein by its unique combination of input bits. For example, the leftmost AND gate in FIG. 3 will be referred to herein as "AND gate X0Y0." Also, for ease of illustration and to facilitate an understanding of the principles of operation of 4-bit charge-scaling multiplier 300, the AND gates have been arranged into vertically-oriented groups G0, G1, G2, G3, G4, G5 and G6.

Each of these groups of AND gates, e.g., group G1, includes AND gates having identical sums "m" of bit numbers "n" of the X and Y inputs received by the AND gates within the group. Each group of AND gates has a unique sum value "m." For example the X1Y0 AND gate and the X0Y1 AND gate within the G1 group both have a sum "m" of 1, i.e., the sum of the bit numbers "n" of 0 and 1. Similarly, the sum "m" of group G2 is 2, and so on. The sum "m" of each respective group of AND gates corresponds to the relative significance or bit number of the product terms generated by AND gates within the group. For example, the AND gate X1Y0 in group G1 generates the product of X1 and Y0. An X1 bit that is a logical "1" has a value of $1*2^1=2$, while a Y0 bit that is a logical "1" has a value of $1*2^0=1$. The product of these values is $2*1=2$, which corresponds to $2^1$. The significance or bit number of this product term is therefore "1," corresponding to the group G1. Each of the other groups, i.e., G0, G2 . . . G6, include AND gates configured to generate, within each group, product terms of the same relative significance.

According to embodiments, the 4-bit charge-scaling multiplier 300 is divided into two sections; least-significant (LS) section 312 and most-significant (MS) 314. Each section 312 and 314 includes groups of AND gates and associated scaled capacitors $C_{Scaled}$ 325, and a local product node, i.e., $PROD_B$ and $PROD_A$, respectively. In embodiments, section 312 can be understood to be the LS section, as it corresponds to the least-significant product terms, i.e., those having a sum "m" of 0, 1, 2 or 3. Similarly, section 314 can be understood to be the MS section, as it corresponds to the most-significant product terms, i.e., those having a sum "m" of 4, 5 or 6. In some embodiments, the 4-bit charge-scaling multiplier 300 can have 3 or more sections. According to embodiments, the respective local product nodes, e.g., $PROD_A$ and $PROD_B$, of each pair of electrically adjacent sections, e.g., 312 and 314, are interconnected to the terminals of the attenuation capacitor $C_{ATT}$.

The output of each of the AND gates within a particular group of AND gates is electrically connected to a terminal of a respective scaled capacitor $C_{Scaled}$ 325. The other terminal of the respective scaled capacitor is electrically connected to the local product node of the section including the particular group of AND gates. Continuing with the above example, the outputs of AND gates X1Y0 and X0Y1 are each connected to a terminal of a respective scaled capacitor, and the other terminals of these scaled capacitors $C_{Scaled}$ 325 are electrically interconnected to the local product node $PROD_B$ of the LS section 312, which contains the group G1 of AND gates X1Y0 and X0Y1.

In embodiments, each of the scaled capacitors $C_{Scaled}$ 325 associated with a group of AND gates is assigned a capacitance value proportional to the significance of the product terms generated by the respective group of AND gates. For example, each of the scaled capacitors $C_{Scaled}$ 325 associated with a group of AND gates has a capacitance value equal to $2^{(m-1)}*C/4$, where "1" is a smallest of the sums "m" corresponding to the groups of AND gates located within a respective section. Following the above example, for the group G1, the smallest sum "1" of sums "m" corresponding to the groups of AND gates located within the respective section LS section 312, is 0, corresponding to group G0. The sum "m" corresponding to group G1 is 1. The capacitance value of scaled capacitors $C_{Scaled}$ 325 within group G1 is therefore: $2^{(1-0)}*C/4=1/2*C$. The value of scaled capacitors $C_{Scaled}$ 325 associated with other groups of AND gates are similarly calculated and assigned. Accordingly, the resulting capacitance values of scaled capacitors $C_{Scaled}$ 325 associated with groups of AND gates within each of the LS and MS sections, progressing from least-significant to most-significant groups, are C/4, C/2, C and 2C, where $C=C_{UNIT}$.

According to embodiments, the binary-weighted ratio of the scaled capacitors $C_{Scaled}$ 325, i.e., a ratio of 1:2:4:8, in conjunction with the interconnected reference capacitor $C_{REF}$ and the attenuation capacitor $C_{ATT}$, allows the 4-bit charge-scaling multiplier 300 to function, in response to applied voltage levels at the X and Y inputs, as a capacitive voltage-divider circuit. During operation of the multiplier 300, a voltage level, e.g., an IC supply voltage $V_{DD}$ or GND, representing a logical "1" or logical "0," respectively, is applied to each bit of the two sets of inputs representing the two binary numbers X and Y.

The AND gates within 4-bit charge-scaling multiplier 300 respond to these applied inputs by generating respective product terms, which are subsequently applied to respective, electrically connected, scaled capacitors $C_{Scaled}$ 325. The local product node $PROD_A$ is thus drawn to a product voltage proportional to the binary-weighted product of the input values X0:X3 and Y0:Y3, where the product voltage can be in a range between GND and a supply voltage $V_{DD}/4$. A product voltage that is proportional to the binary-weighted product of the input values is further depicted in FIG. 7 and discussed in the associated text. In some embodiments, an IC supply voltage $V_{DD}$ can be within a specified range, for example, between 0.9 V and 1.1 V.

According to embodiments, all of the product terms within 4-bit charge-scaling multiplier 300 are generated simultaneously, in response to the application of binary input numbers X and Y to the multiplier. The product terms are subsequently summed simultaneously, through the charge-scaling and voltage division provided by the scaled capacitors $C_{Scaled}$ 325. The product term generation and a subsequent summing does not rely upon the generation of carry signals and their associated delay, as depicted and discussed in reference to FIG. 2. Embodiments of the present disclosure can therefore be particularly useful in providing enhanced speed of binary number multiplication through the use of circuitry that consumes less power and less IC circuit area than traditional binary multiplication circuits.

According to embodiments, 4-bit charge-scaling multiplier 300 also includes reference capacitor $C_{REF}$ electrically connected to GND and to a local product node, e.g., $PROD_B$, within the LS section of the multiplier 300. In embodiments, the scaled capacitors $C_{Scaled}$ 325 and the reference capacitor $C_{REF}$ can include capacitor types such as metal-insulator-metal MIM capacitors, metal-oxide semiconductor MOS capacitors, and deep trench capacitors.

The value of the attenuation capacitor, $C_{ATT}$, connected between two electrically adjacent and balanced sections, e.g., the MS section 314 and the LS section 312, can be defined by the following equation:

$$C_{ATT} = C_{UNIT} * \frac{\sum LS\, Section\, C}{\sum MS\, Section\, C}$$

Where:
$C_{ATT}$=attenuation capacitance connected between the $PROD_A$ node and the $PROD_B$ node, in farads F
$C_{UNIT}$=C=the unit capacitance in farads F
$\Sigma$LS Section C=sum of the scaled capacitances in the LS section in farads F
$\Sigma$MS Section C=sum of the scaled capacitances in the MS section in farads F Interconnecting nodes $PROD_A$ and $PROD_B$ with attenuation capacitor $C_{ATT}$ can be useful in scaling the effect of the inputs of the least-significant section 312 on the output product voltage, e.g., PROD voltage 710, FIG. 7, to be proportionally less significant than the inputs of the most-significant section 314. The use of attenuation capacitor $C_{ATT}$ can also be helpful in managing or reducing the total capacitance requirements for implementing a charge-scaling multiplier circuit design. For example, the inclusion of attenuation capacitor(s) within charge-scaling multiplier 300, in conjunction with limiting the number of scaled capacitors $C_{Scale}$d 325 in each section, can result in the relatively small ratios, e.g., 1:2 or 1:4, between the relative sizes and capacitance values of scaled capacitors $C_{Scaled}$ 325 in each section of the multiplier 300. These relatively small capacitance ratios can effectively limit the size of the largest scaled capacitor within a section, and therefore the amount of total capacitance needed to implement a particular charge-scaling multiplier design. Such limitations can result in managed and limited IC circuit area requirements for charge-scaling multiplier designs.

According to embodiments, the input of unity gain amp 310 is electrically connected to local product node $PROD_A$ of the MS section 314 of 4-bit charge-scaling multiplier 300. The output of unity gain amp 310 is the PROD output node. Unity gain amp 310 can be useful for driving the PROD output node to a voltage equivalent to a voltage on the local product node $PROD_A$. Unity gain amp 310 can be particularly useful for isolating and stabilizing the analog product output voltage of the local product node $PROD_A$ from being affected by low impedance or impedance variations of the PROD output node. In embodiments, unity gain amp 310 can be, for example, an operational amplifier or other type of amplifier fabricated within an IC, e.g., 110, FIG. 1. In some embodiments, the analog output voltage driven onto the PROD output node by unity gain amp 310 can be converted to a digital signal by an ADC, e.g., 106, FIG. 1.

In some embodiments the analog output voltage driven onto the PROD output node by unity gain amp 310 can be used as an input to a circuit capable of receiving an analog voltage.

In embodiments, each of the multiple sections 312 and 314 also includes local reset devices, e.g., N2 and N1, respectively. These local reset devices are electrically connected to GND, and through their output terminals, to the $PROD_B$ and $PROD_A$ nodes, respectively. During operation of the 4-bit charge-scaling multiplier 300, the RESET signal can be asserted, e.g., to a logical "1" state, to activate local reset devices N2 and N1, following the multiplication of two binary numbers. The activation of N2 and N1 can draw the local product nodes $PROD_B$ and $PROD_A$ to GND. Resetting the multiplier 300 by drawing the $PROD_B$ and $PROD_A$ nodes to GND can be useful in preparing the multiplier 300 to receive a subsequent set of input signals by drawing both terminals of the attenuation capacitor $C_{ATT}$ to GND. The return of inputs X(0:3) and Y(0:3) to GND following the multiplication of a set of numbers can similarly draw the AND gate outputs, and thus the attenuation capacitor input terminals to GND. In some embodiments, the reset devices can be, for example, N-channel field-effect transistors NFETs, where an NFET input terminal is understood to be the gate of the NFET, and an NFET output terminal is understood to be the drain of the NFET. In such embodiments, the source terminal of the NFET can be connected to GND.

According to embodiments, each of the groups of AND gates that includes a number "G" of AND gates that is less than a maximum number "M" of AND gates included within each of the groups of AND gates includes a set of M-G additional scaled capacitors $C_{Scaled}$ 325. In embodiments, each scaled capacitor of the set of M-G additional scaled capacitors $C_{Scaled}$ 325 has a capacitance value equal to the value of the other scaled capacitors associated with the respective groups of AND gates. According to embodiments, each scaled capacitor of the set of M-G additional scaled capacitors $C_{Scaled}$ 325 is connected to the respective local product node and to GND.

In embodiments, an additional set of "M" scaled capacitors is electrically interconnected between the MS local product node and GND. Each of the additional "M" scaled capacitors has a capacitance value equal to twice the value of a largest other scaled capacitor within the MS section. By way of example, a set of four additional scaled capacitors having values of 2C is included on the right side of 4-bit charge-scaling multiplier 300, FIG. 3.

In some embodiments, the precision of multiplication operations performed with charge-scaling multiplier such as multiplier 300 may be limited by factors previously discussed in reference to 4-bit charge-scaling multiplier 100, FIG. 1. In certain applications, the functional accuracy of a charge-scaling multiplier may be limited by the resolution of an ADC such as 106.

Embodiments of the present disclosure can also be integrated effectively into computing hardware and systems designed to perform mixed-precision mathematical operations, in which trade-offs are dynamically made by the system between computational speed and computational accuracy. Embodiments can provide such a system with a particularly rapid and energy-efficient alternative to traditional binary computational hardware.

Figure 4:
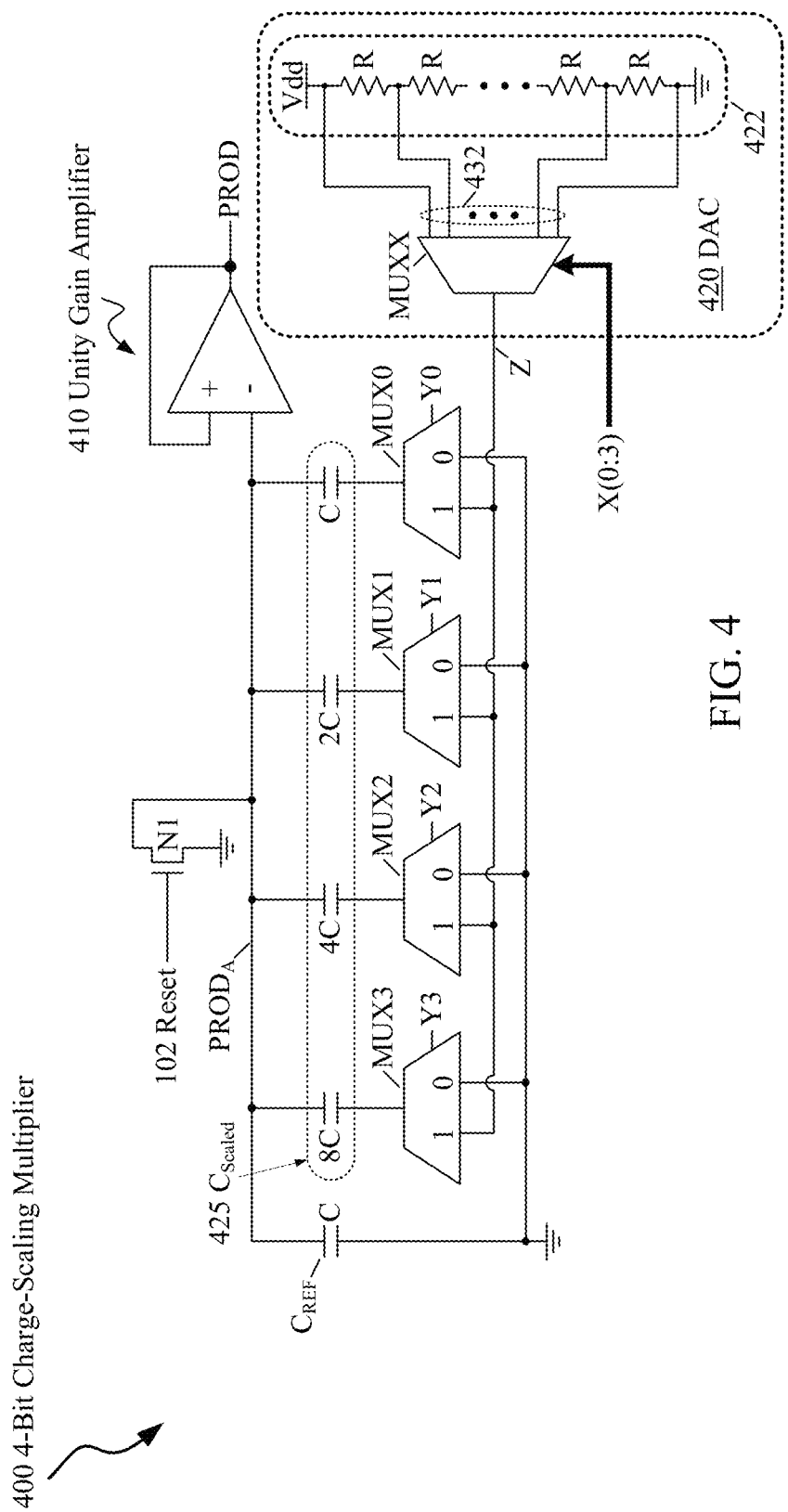
FIG. 4 is a schematic diagram depicting a 4-bit charge-scaling multiplier circuit, according to embodiments consistent with the figures.

FIG. 4 includes a schematic depiction of a 4-bit charge-scaling multiplier circuit 400 which can be fabricated within an IC 110, FIG. 1, according to embodiments generally consistent with the figures. Consistent with the configuration depicted in FIG. 1, the multiplier circuit 400 can also be electrically interconnected to digital logic 104, analog-to-digital converter 106 and digital logic 108 circuits, and can interact with these circuits in a manner consistent with charge-scaling multiplier 100, FIG. 1. For example, 4-bit charge-scaling multiplier 400 can receive binary numbers X and Y, and a RESET signal from digital logic 104, which can supply an interleaved sequence of binary numbers X and Y, and RESET signals to the multiplier 400. According to embodiments, the input signals X, Y and RESET, and the output PROD signal have consistent signaling levels, timing and protocol to those of multiplier circuit 100. The input and output waveforms of 4-bit charge-scaling multiplier circuit 400 are likewise consistent with the input and output waveforms of multiplier circuit 100, as depicted in FIG. 7. The charge-scaling multiplier circuit 400 can be useful in providing rapid multiplication of received binary numbers for various types of ICs that are fabricated with a wide variety of IC technologies and associated design methodologies.

Charge-scaling multiplier 400 includes two sets of "N" inputs, where N=4, i.e., X(0:3) and Y(0:3), configured to receive 4-bit binary numbers X and Y, respectively. Indexing of the X and Y inputs is consistent with indexing of similar X and Y inputs of 4-bit charge-scaling multiplier 100, FIG. 1.

4-bit charge-scaling multiplier 400 includes a digital-to-analog converter (DAC) 420 used to generate an analog voltage on DAC output node Z that represents to the value of X input X(0:3). This analog voltage is then selected by each multiplexer (mux) of the set of analog muxes MUX0 . . . MUX3, in response to the values of Y(0:3), which are received at a respective "select" input of each mux. The output voltage of each of these muxes is subsequently scaled by a set of scaled capacitors $C_{Scaled}$ 425, in conjunction with reference capacitor $C_{REF}$. Each scaling capacitor $C_{Scaled}$ 425 is electrically connected to a respective output of a mux. This scaling, in conjunction with the conversion of X(0:3) provided by DAC 420, produces an analog product output voltage on the PROD output node that represents the product of the binary numbers received on the X and Y inputs. As described with reference to FIG. 3, the use of analog voltage-scaling circuits and techniques, as depicted in FIG. 4, can be useful in providing rapid multiplication of binary numbers that eliminates the need for, and delay resulting from, carry term generation and propagation. Such circuits and techniques can consume substantially less power and IC circuit area than binary circuits performing an equivalent function.

DAC 420 is configured to drive, to DAC output node Z, an analog voltage that represents a value of the 4-bit binary number X(0:3). According to embodiments, the DAC 420 includes a voltage divider circuit 422 electrically connected to multiplexer MUXX. In embodiments, voltage divider circuit 422 includes a set of resistors, each having an equal resistance value "R," that is electrically interconnected to generate a set of $2^N$ analog voltages. In the example embodiment, where N=4, the set of resistors is electrically interconnected to generate and provide a set of $2^4$=16 analog voltages to the mux inputs 432 of multiplexer MUXX. Other embodiments may include a different number and interconnection of resistors in order to provide a number, i.e., $2^N$, of analog voltages corresponding to an input having N bits, where N is not equal to 4.

According to embodiments, the resistance value R of each of the resistors is equal, within manufacturing tolerances applicable to resistors fabricated within an IC. These equal values, in conjunction with the depicted circuit topology of voltage divider circuit 422, ensure that the resulting $2^N$ analog voltages are evenly distributed in a voltage range that includes and is between GND and $V_{DD}$. This even distribution of voltages can enable more accurate conversion of the product output voltage into binary numbers by an ADC than can an uneven distribution of voltages.

Analog muxes such as MUXX, MUX0, MUX1, MUX2 and MUX3, can be useful for selecting, in response to signals applied to one or more select inputs, one of several analog voltages received at its analog inputs. An analog voltage selected from an analog input is subsequently driven onto an output node. Analog muxes can be also be referred to as "pass-gate" or "transmission-gate" devices. In the context of the present disclosure an analog mux can be particularly useful, in conjunction with a voltage divider circuit, in "translating" a set of digital signals, e.g., X(0:3) into a "scaled" analog voltage level that represents the number encoded by the digital signals. Analog multiplexer MUXX is configured to receive, through the 16 analog mux inputs 432 electrically connected to the voltage divider circuit 422, the set of 16 analog voltages generated by voltage divider circuit 422.

According to embodiments, the binary number X(0:3) is received by MUXX, at a set of 4 select inputs. The bits (0:3) of this binary number X are used to select one of the 16 analog voltages received at mux inputs 432 from the voltage divider circuit 422 to be driven onto the DAC output node Z of the analog mux MUXX. This DAC output voltage is used to represent the value of the 4-bit binary number X(0:3).

In embodiments, the DAC output node Z is electrically interconnected to one input of each of the muxes MUX0 . . . MUX3. In embodiments having other numbers of bits, e.g., 3 or 5, the number of muxes, e.g., MUX0 will correspond to this other number of bits. Another input of each of the muxes MUX0 . . . MUX3 is connected to GND. According to embodiments, each of the muxes MUX0 . . . MUX3 is configured to drive, in response to the respective bit of the input number Y applied to its select input, either the DAC output node Z voltage or GND onto its output. For example, if input signal Y0 is a logical "1," the voltage on DAC output node Z will be driven onto the output node of MUX0. If input signal Y0 is a logical "0," the output node of MUX0 will be driven to GND. The output node of each of the other muxes MUX1 . . . MUX3 are similarly driven in response to the values of input signals Y1:Y3.

The output node of each of the muxes MUX0 . . . MUX3 is electrically connected to a terminal of a corresponding scaled capacitor $C_{Scaled}$ 425. The other terminal of each scaled capacitor $C_{Scaled}$ 425 is electrically connected to the local product node $PROD_A$. Similar to the number of muxes, e.g., MUX0, the number of scaled capacitors will correspond to the number of bits in the binary number Y input.

In embodiments, each scaled capacitor $C_{Scaled}$ 425 is assigned a capacitance value proportional to the significance "n" of the corresponding Y input bit used as a select input of the mux interconnected to the capacitor. Each scaled capacitor $C_{Scaled}$ 425 has a capacitance value equal to $2^n*C$. By way of example, the capacitance value of scaled capacitor $C_{Scaled}$ 425 for MUX0 having a select input of Y0 is $2^n*C=2^0*C$ or C. Similarly the capacitance value of scaled capacitor $C_{Scaled}$ 425 for MUX3 having a select input of Y3 is $2^3*C$ or 8*C, denoted in FIG. 4 as "8C."

According to embodiments, 4-bit charge-scaling multiplier 400 also includes reference capacitor $C_{REF}$ electrically connected to GND and to the local product node $PROD_A$, where $C_{REF}$ has a value of C. In embodiments, the reference capacitor $C_{REF}$ and scaled capacitors $C_{Scaled}$ 425 can include capacitor types such as metal-insulator-metal MIM capacitors, metal-oxide semiconductor MOS capacitors, and deep trench capacitors.

According to embodiments, the binary-weighted ratio of the scaled capacitors $C_{Scaled}$, i.e., a ratio of 1:2:4:8, in conjunction with the interconnected reference capacitor $C_{REF}$ allows the 4-bit charge-scaling multiplier 400 to function as a capacitive voltage-divider circuit in response to applied voltage levels at the X and Y inputs. During operation of the multiplier 400, a voltage level, e.g., an IC supply voltage $V_{DD}$ or GND, representing a logical 1 or logical 0, respectively, is applied to each bit of the two sets of inputs representing the two binary numbers X and Y.

The analog voltage represented by X(0:3) is scaled by the MUXX multiplexor and also scaled by the scaled capacitors $C_{Scaled}$ 425 electrically interconnected to the local product node $PROD_A$. The $PROD_A$ node is thus drawn to a product voltage proportional to the binary-weighted product of the input values X0:X3 and Y0:Y3, where the product voltage can be in a range between GND and a supply voltage $V_{DD}$. A product voltage that is proportional to the binary-weighted product of the input values is further depicted in FIG. 7 and discussed in the associated text. In some embodiments, an IC supply voltage $V_{DD}$ can be within a specified range, for example, between 0.9 V and 1.1 V.

According to embodiments, the analog voltages representing X and Y within 4-bit charge-scaling multiplier 400 are generated, selected and scaled directly, in response to the application of binary input numbers X and Y to the multiplier. The analog voltage generation, scaling and summing does not rely upon the generation of carry signals and associated delay, as depicted and discussed in reference to FIG. 2. Embodiments of the present disclosure can therefore be used to provide more rapid multiplications of binary numbers with circuitry that uses less power and consumes less IC circuit area than traditional binary multiplication circuits.

According to embodiments, the input of unity gain amp 410 is electrically connected to local product node $PROD_A$, and the output is electrically connected to the PROD output node. Unity gain amp 410 can be useful for driving the PROD output node to a voltage equivalent to a voltage on the local product node $PROD_A$. Unity gain amp 410 can be particularly useful for isolating and stabilizing the analog product output voltage of the local product node $PROD_A$ from being affected by low impedance or impedance variations of the PROD output node. In embodiments, unity gain amp 410 can be, for example, an operational amplifier or other type of amplifier fabricated within an IC, e.g., 110, FIG. 1.

In embodiments the 4-bit charge-scaling multiplier 400 also includes a local reset device N1. This local reset device is electrically connected to GND, and through its output terminal, to the $PROD_A$ node. During operation of the 4-bit charge-scaling multiplier 400, the RESET signal can be asserted, e.g., to a logical "1" state, to activate local reset device N1, following the multiplication of two binary numbers. The activation of N1 can draw the local product node $PROD_A$ to GND. In some embodiments, the reset device can be, for example, an N-channel field-effect transistor (NFET), where an NFET input terminal is understood to be the gate of the NFET, and an NFET output terminal is understood to be the drain of the NFET. In such embodiments, the source terminal of the NFET can be connected to GND.

Resetting the multiplier 400 by drawing the $PROD_A$ node to GND can be useful in preparing the multiplier 400 to receive a subsequent set of input signals representing binary numbers by drawing terminals of the scaled capacitors $C_{Scaled}$ 425 to GND. The return of inputs Y(0:3) to GND following the multiplication of a set of numbers can similarly draw the MUX0..MUX3 outputs to GND, and thus the other terminals of the scaled capacitors $C_{Scaled}$ 425 to GND.

In some embodiments, the precision of multiplication operations performed with charge-scaling multiplier such as multiplier 400 may be limited by factors previously discussed in reference to 4-bit charge-scaling multiplier 100, FIG. 1. In certain applications, the functional accuracy of a charge-scaling multiplier may be limited by the resolution of an ADC such as 106.

Embodiments of the present disclosure can also be integrated effectively into computing hardware and systems designed to perform mixed-precision mathematical operations, in which trade-offs are dynamically made by the system between computational speed and computational accuracy. Embodiments can provide such a system with a particularly rapid and energy-efficient alternative to traditional binary computational hardware.

Figure 5:
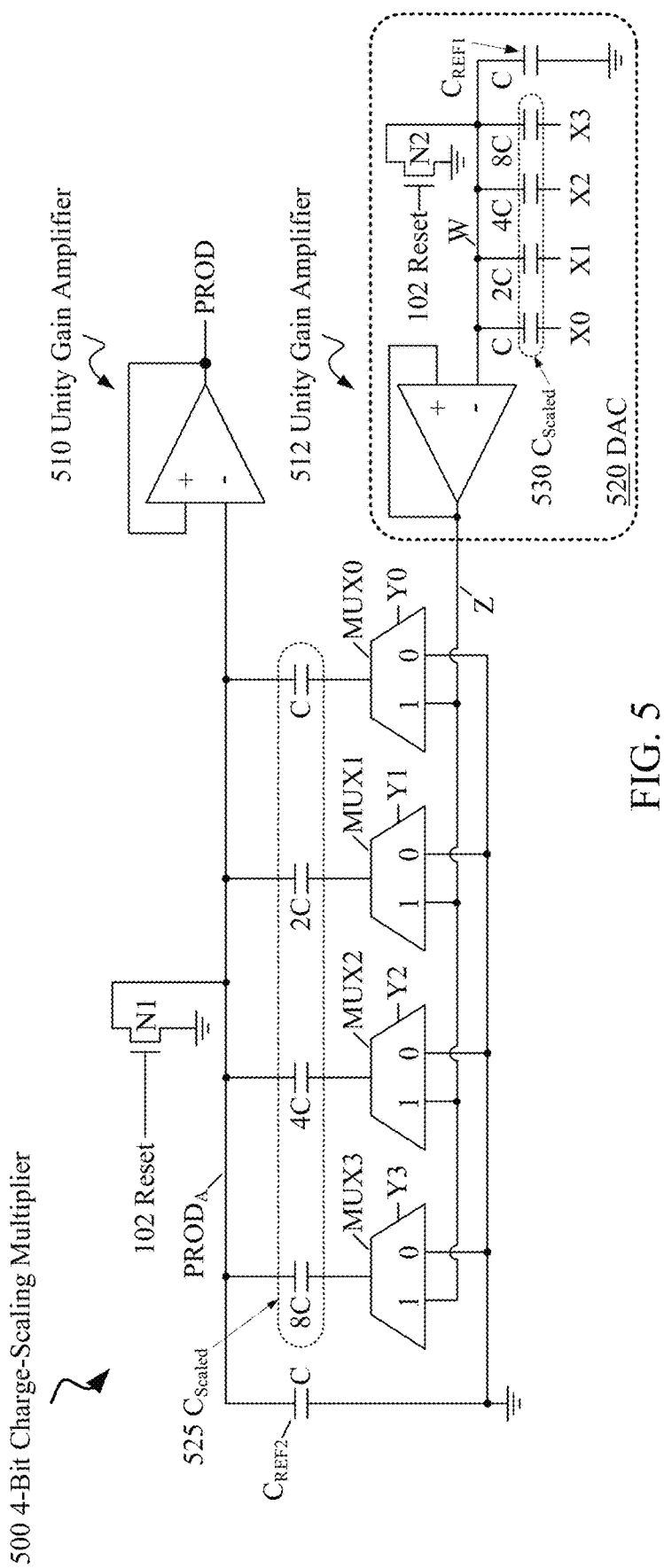
FIG. 5 is a schematic diagram depicting a 4-bit charge-scaling multiplier circuit, according to embodiments consistent with the figures.

FIG. 5 includes a schematic depiction of a 4-bit charge-scaling multiplier circuit 500 which can be fabricated within an IC 110, FIG. 1, according to embodiments generally consistent with the figures. Consistent with the configuration depicted in FIG. 1, the multiplier circuit 500 can also be electrically interconnected to digital logic 104, analog-to-digital converter 106 and digital logic 108 circuits, and can interact with these circuits in a manner consistent with charge-scaling multiplier 100, FIG. 1. For example, 4-bit charge-scaling multiplier 500 can receive binary numbers X and Y, and a RESET signal from digital logic 104, which can supply an interleaved sequence of binary numbers X and Y, and RESET signals to the multiplier 500. According to embodiments, the input signals X, Y and RESET, and the output PROD signal have consistent signaling levels, timing and protocol to those of multiplier circuit 100. The input and output waveforms of 4-bit charge-scaling multiplier circuit 500 are likewise consistent with the input and output waveforms of multiplier circuit 100, as depicted in FIG. 7.

Charge-scaling multiplier 500 includes two sets of "N" inputs, where N=4, i.e., X(0:3) and Y(0:3), configured to receive 4-bit binary numbers X and Y, respectively. Indexing of the X and Y inputs is consistent with indexing of similar X and Y inputs of 4-bit charge-scaling multiplier 100, FIG. 1.

4-bit charge-scaling multiplier 500 includes a DAC 520 used to generate an analog voltage on DAC output node Z that represents to the value of X input X(0:3). This analog voltage is then selected by each mux of the set of analog muxes MUX0 . . . MUX3, in response to the values of Y(0:3), which are received at a respective "select" input of each analog mux. The output voltage of each of these muxes is subsequently scaled by a set of scaled capacitors $C_{Scaled}$ 525, in conjunction with a reference capacitor $C_{REF2}$. Each scaling capacitor $C_{Scaled}$ 525 is electrically connected to a respective output of a mux. This scaling, in conjunction with the conversion of X(0:3) provided by DAC 520, produces an analog product output voltage on the PROD output node that represents the product of the binary numbers received on the X and Y inputs. As described with reference to FIG. 3, the use of analog voltage-scaling circuits and techniques, as depicted in FIG. 5, can be useful in providing rapid multiplication of binary numbers that eliminates the need for, and delay resulting from, carry term generation and propagation.

Such circuits and techniques can consume substantially less power and IC circuit area than binary circuits performing an equivalent function.

DAC 520 is configured to drive, to DAC output node Z, an analog voltage that represents a value of the 4-bit binary number X(0:3). According to embodiments, the DAC 520 includes a set of scaled capacitors $C_{Scaled}$ 530 electrically connected to unity gain amplifier 512.

The set of scaled capacitors $C_{Scaled}$ 530 each has one terminal electrically interconnected to the inputs X(0:3), while the other terminal of each capacitor of the set of scaled capacitors $C_{Scaled}$ 530 is electrically connected to the scaled node W. The set of scaled capacitors $C_{Scaled}$ 530 can be used in conjunction with reference capacitor $C_{REF1}$ in order to draw the scaled node W to an analog voltage that represents the value of the binary number X encoded in the inputs X(0:3). In embodiments, reference capacitor $C_{REF1}$ has a value of C and is electrically connected to GND and to scaled node W.

In the example embodiment, where N=4, the set of scaled capacitors $C_{Scaled}$ 530 is electrically interconnected to generate and provide a set of $2^4=16$ possible analog voltages on the scaled node W. Other embodiments may include a different number of scaled capacitors $C_{Scaled}$ 530 in order to provide a number, i.e., $2^N$, of analog voltages corresponding to an input having N bits, where N is not equal to 4.

According to embodiments, the input of unity gain amp 512 is electrically connected to scaled node W, and the output of unity gain amp 512 is electrically connected to the DAC output node Z. Unity gain amp 512 can be useful for driving the DAC output node Z to a voltage equivalent to a voltage on the scaled node W. Unity gain amp 512 can be particularly useful for isolating and stabilizing the voltage on the scaled node W from being affected by low impedance or impedance variations of the DAC output node Z. In embodiments, unity gain amp 512 can be, for example, an operational amplifier or other type of amplifier fabricated within an IC, e.g., 110, FIG. 1.

Analog muxes such as MUX0, MUX1, MUX2 and MUX3, can be useful for selecting, in response to signals applied to one or more select inputs, one of several analog voltages received at its inputs. In embodiments, the DAC output node Z is electrically interconnected to one input of each of the muxes MUX0 . . . MUX3. In embodiments having other numbers of bits, e.g., 3 or 5, the number of muxes, e.g., MUX0 will correspond to this other number of bits. Another input of each of the muxes MUX0 . . . MUX3 is connected to GND. According to embodiments, each of the muxes MUX0 . . . MUX3 is configured to drive, in response to the respective bit of the input number Y applied to its select input, either the DAC output node Z voltage or GND onto its output. For example, if input signal Y0 is a logical "1," the voltage on DAC output node Z will be driven onto the output node of MUX0. If input signal Y0 is a logical "0," the output node of MUX0 will be driven to GND. The output node of each of the other muxes MUX1 MUX3 are similarly driven in response to the values of input signals Y1:Y3.

The output node of each of the muxes MUX0 . . . MUX3 is electrically connected to a terminal of a corresponding scaled capacitor $C_{Scaled}$ 525. The other terminal of each scaled capacitor $C_{Scaled}$ 525 is electrically connected to the local product node $PROD_A$. Similar to the number of muxes, e.g., MUX0, the number of scaled capacitors will correspond to the number of bits in the binary number Y input.

In embodiments, each scaled capacitor $C_{Scaled}$ 525 is assigned a capacitance value proportional to the significance "n" of the corresponding Y input bit used as a select input of the mux interconnected to the capacitor. Each scaled capacitor $C_{Scaled}$ 525 has a capacitance value equal to $2^n * C$. By way of example, the capacitance value of scaled capacitor $C_{Scaled}$ 525 for MUX0 having a select input of Y0 is: $2^n * C = 2^0 * C$ or C. Similarly the capacitance value of scaled capacitor $C_{Scaled}$ 525 for MUX3 having a select input of Y3 is $2^3 * C$ or $8*C$, denoted in FIG. 5 as "8C."

According to embodiments, 4-bit charge-scaling multiplier 500 also includes a reference capacitor $C_{REF2}$ electrically connected to GND and to the local product node $PROD_A$. According to embodiments, the binary-weighted ratio of the scaled capacitors $C_{Scaled}$ 525, i.e., a ratio of 1:2:4:8, in conjunction with the interconnected reference capacitor $C_{REF2}$ allows the 4-bit charge-scaling multiplier 500 to function as a capacitive voltage-divider circuit in response to applied voltage levels at the X and Y inputs. During operation of the multiplier 500, a voltage level, e.g., an IC supply voltage $V_{DD}$ or GND, representing a logical 1 or logical 0, respectively, is applied to each bit of the two sets of inputs representing the two binary numbers X and Y.

The analog voltage represented by X(0:3) is scaled by the scaled capacitors $C_{Scaled}$ 530 and also scaled by the scaled capacitors $C_{Scaled}$ 525 electrically interconnected to the local product node $PROD_A$. The $PROD_A$ node is thus drawn to a product voltage proportional to the binary-weighted product of the input values X0:X3 and Y0:Y3, where the product voltage can be in a range between GND and a supply voltage $V_{DD}$. A product voltage that is proportional to the binary-weighted product of the input values is further depicted in FIG. 7 and discussed in the associated text. In some embodiments, an IC supply voltage $V_{DD}$ can be within a specified range, for example, between 0.9 V and 1.1 V.

According to embodiments, the analog voltages representing X and Y within 4-bit charge-scaling multiplier 500 are generated, selected and scaled directly, in response to the application of binary input numbers X and Y to the multiplier. The analog voltage generation, scaling and summing does not rely upon the generation of carry signals and associated delay, as depicted and discussed in reference to FIG. 2. Embodiments of the present disclosure can therefore be used to provide more rapid multiplications of binary numbers with circuitry that uses less power and consumes less IC circuit area than traditional binary multiplication circuits.

According to embodiments, the input of unity gain amp 510 is electrically connected to local product node $PROD_A$, and the output is electrically connected to the PROD output node. Unity gain amp 510 can be useful for driving the PROD output node to a voltage equivalent to a voltage on the local product node $PROD_A$. Unity gain amp 510 can be particularly useful for isolating and stabilizing the analog product output voltage of the local product node $PROD_A$ from being affected by low impedance or impedance variations of the PROD output node. In embodiments, unity gain amp 510 can be, for example, an operational amplifier or other type of amplifier fabricated within an IC, e.g., 110, FIG. 1.

In embodiments the 4-bit charge-scaling multiplier 500 also includes local reset devices N1 and N2. These local reset devices are electrically connected to GND, and through their output terminals, to the local product node $PROD_A$ and scaled node W, respectively. During operation of the 4-bit charge-scaling multiplier 500, the RESET signal can be asserted, e.g., to a logical "1" state, to activate local reset devices N1 and N2, following the multiplication of two binary numbers. The activation of N1 and N2 can draw the PROD$_A$ node and scaled node W to GND. In some embodiments, the reset device can be, for example, NFETs terminal is understood to be the drain of the NFET. In such embodiments, the source terminal of the NFET can be connected to GND.

Resetting the multiplier 500 by drawing the PROD$_A$ node and scaled node W to GND can be useful in preparing the multiplier 500 to receive a subsequent set of input signals representing binary numbers by drawing terminals of the scaled capacitors C$_{Scaled}$ 525 and C$_{Scaled}$ 530 to GND. The return of inputs Y(0:3) to GND following a multiplication operation can similarly draw the MUX0 . . . MUX3 outputs to GND, and thus the other terminals of the scaled capacitors C$_{Scaled}$ 525 to GND. Similarly, the return of inputs X(0:3) to GND following a multiplication operation can similarly draw the other terminals of the scaled capacitors C$_{Scaled}$ 530 to GND.

In some embodiments, the precision of multiplication operations performed with charge-scaling multiplier such as multiplier 500 may be limited by factors previously discussed in reference to 4-bit charge-scaling multiplier 100, FIG. 1.

Embodiments of the present disclosure can also be integrated effectively into computing hardware and systems designed to perform mixed-precision mathematical operations, in which trade-offs are dynamically made by the system between computational speed and computational accuracy. Embodiments can provide such a system with a particularly rapid and energy-efficient alternative to traditional binary computational hardware.

Figure 6:
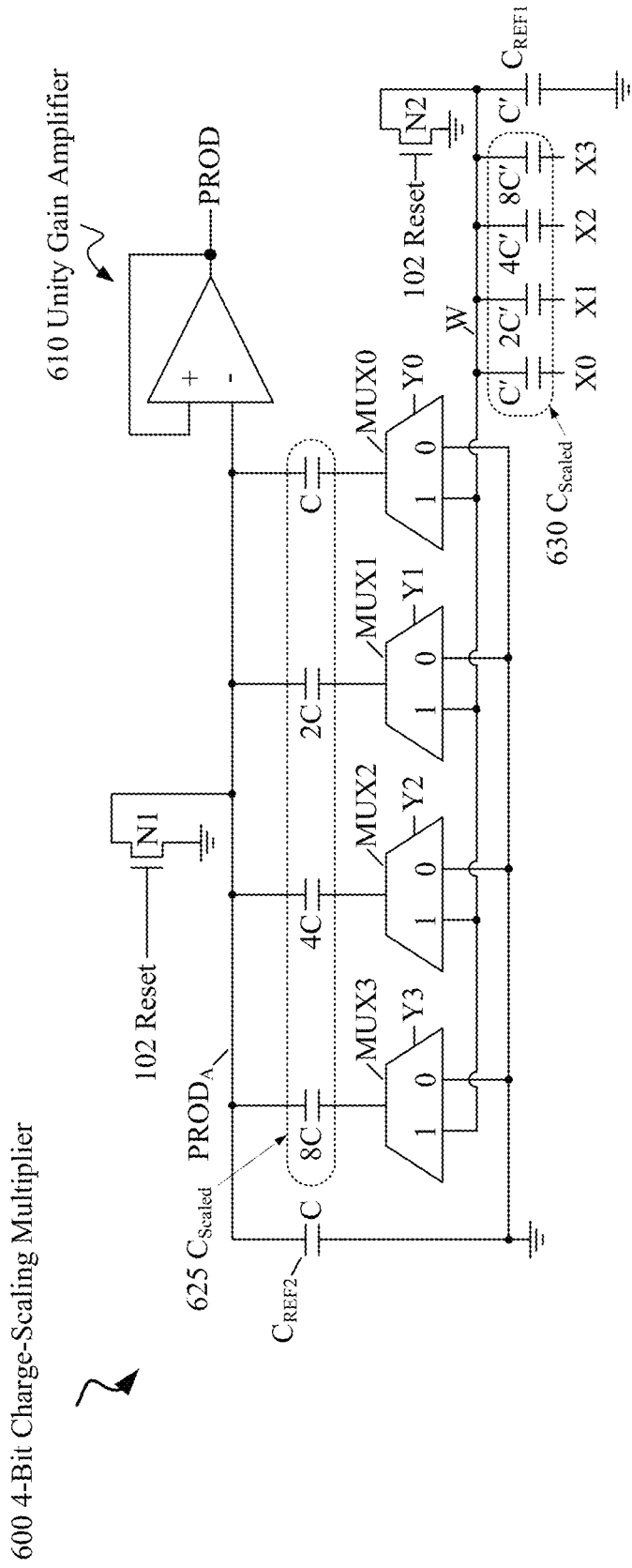
FIG. 6 is a schematic diagram depicting a 4-bit charge-scaling multiplier circuit, according to embodiments consistent with the figures.

FIG. 6 includes a schematic depiction of a 4-bit charge-scaling multiplier circuit 600 which can be fabricated within an IC 110, FIG. 1, according to embodiments generally consistent with the figures. Consistent with the configuration depicted in FIG. 1, the multiplier circuit 600 can also be electrically interconnected to digital logic 104, analog-to-digital converter 106 and digital logic 108 circuits, and can interact with these circuits in a manner consistent with charge-scaling multiplier 100, FIG. 1. For example, 4-bit charge-scaling multiplier 600 can receive binary numbers X and Y, and a RESET signal from digital logic 104, which can supply an interleaved sequence of binary numbers X and Y, and RESET signals to the multiplier 600. According to embodiments, the input signals X, Y and RESET, and the output PROD signal have consistent signaling levels, timing and protocol to those of multiplier circuit 100. The input and output waveforms of 4-bit charge-scaling multiplier circuit 600 are likewise consistent with the input and output waveforms of multiplier circuit 100, as depicted in FIG. 7.

Charge-scaling multiplier 600 includes two sets of "N" inputs, where N=4, i.e., X(0:3) and Y(0:3), configured to receive 4-bit binary numbers X and Y, respectively. Indexing of the X and Y inputs is consistent with indexing of similar X and Y inputs of 4-bit charge-scaling multiplier 100, FIG. 1.

4-bit charge-scaling multiplier 600 includes a set of scaled capacitors C$_{Scaled}$ 630 used to generate an analog voltage on scaled node W that represents to the value of X input X(0:3). This analog voltage is then selected by each mux of the set of analog muxes MUX0 . . . MUX3, in response to the values of Y(0:3), which are received at a respective "select" input of each analog mux. The output voltage of each of these muxes is subsequently scaled by a set of scaled capacitors C$_{Scaled}$ 625, in conjunction with a reference capacitor C$_{REF2}$. Each scaling capacitor C$_{Scaled}$ 625 is electrically connected to a respective output of a mux. This scaling, in conjunction with the conversion of X(0:3) provided by the set of scaled capacitors C$_{Scaled}$ 630, produces an analog product output voltage on the PROD output node that represents the product of the binary numbers received on the X and Y inputs. As described with reference to FIG. 3, the use of analog voltage-scaling circuits and techniques, as depicted in FIG. 6, can be useful in providing rapid multiplication of binary numbers that eliminates the need for, and delay resulting from, carry term generation and propagation. Such circuits and techniques can consume substantially less power and IC circuit area than binary circuits performing an equivalent function.

In embodiments, 4-bit charge-scaling multiplier 600 includes a set of scaled capacitors C$_{Scaled}$ 630 each having one terminal electrically interconnected to the inputs X(0:3). The other terminal of each capacitor of the set of scaled capacitors C$_{Scaled}$ 630 is electrically connected to the scaled node W. The set of scaled capacitors C$_{Scaled}$ 630 can be used in conjunction with reference capacitor C$_{REF1}$ in order to draw the scaled node W to an analog voltage that represents the value of the binary number X encoded in the inputs X(0:3). In the example embodiment, where N=4, the set of scaled capacitors C$_{Scaled}$ 630 is electrically interconnected to generate and provide a set of $2^4$=16 possible analog voltages on the scaled node W. Other embodiments may include a different number of scaled capacitors C$_{Scaled}$ 630 in order to provide a number, i.e., $2^N$, of analog voltages corresponding to an input having N bits, where N is not equal to 4.

Analog muxes such as MUX0, MUX1, MUX2 and MUX3, can be useful for selecting, in response to signals applied to one or more select inputs, one of several analog voltages received at its inputs. In embodiments, the scaled node W is electrically interconnected to one input of each of the muxes MUX0 . . . MUX3. In embodiments having other numbers of bits, e.g., 3 or 5, the number of muxes, e.g., MUX0, will correspond to this other number of bits. Another input of each of the muxes MUX0 . . . MUX3 is connected to GND. According to embodiments, each of the muxes MUX0 . . . MUX3 is configured to drive, in response to the respective bit of the input number Y applied to its select input, either the scaled node W voltage or GND onto its output. For example, if input signal Y0 is a logical "1," the voltage on the scaled node W will be driven onto the output node of MUX0. If input signal Y0 is a logical "0," the output node of MUX0 will be driven to GND. The output node of each of the other muxes MUX1 . . . MUX3 are similarly driven in response to the values of input signals Y1:Y3.

The output node of each of the muxes MUX0 . . . MUX3 is electrically connected to a terminal of a corresponding scaled capacitor C$_{Scaled}$ 625. The other terminal of each scaled capacitor C$_{Scaled}$ 625 is electrically connected to the local product node PROD$_A$. Similar to the number of muxes, e.g., MUX0, the number of scaled capacitors will correspond to the number of bits in the binary number Y input.

In embodiments, each scaled capacitor C$_{Scaled}$ 625 is assigned a capacitance value proportional to the significance "n" of the corresponding Y input bit used as a select input of the mux interconnected to the capacitor. Each scaled capacitor C$_{Scaled}$ 625 has a capacitance value equal to $2^n*C$. By way of example, the capacitance value of scaled capacitor C$_{Scaled}$ 625 for MUX0 having a select input of Y0 is $2^n*C=2^0*C$ or C. Similarly the capacitance value of scaled capacitor C$_{Scaled}$ 625 for MUX3 having a select input of Y3 is $2^3*C$ or $8*C$, denoted in FIG. 6 as "8C."

According to embodiments, 4-bit charge-scaling multiplier 600 includes a reference capacitor C$_{REF2}$ electrically connected to GND and to the local product node PROD$_A$. According to embodiments, the binary-weighted ratio of the scaled capacitors $C_{Scaled}$ 625, i.e., a ratio of 1:2:4:8, in conjunction with the interconnected reference capacitor $C_{REF2}$ allows the 4-bit charge-scaling multiplier 600 to function as a capacitive voltage-divider circuit in response to applied voltage levels at the X and Y inputs. During operation of the multiplier 600, a voltage level, e.g., an IC supply voltage $V_{DD}$ or GND, representing a logical 1 or logical 0, respectively, is applied to each bit of the two sets of inputs representing the two binary numbers X and Y.

The analog voltage represented by X(0:3) is scaled by the scaled capacitors $C_{Scaled}$ 630 and also scaled by the scaled capacitors $C_{Scaled}$ 625 electrically interconnected to the local product node $PROD_A$. The $PROD_A$ node is thus drawn to a product voltage proportional to the binary-weighted product of the input values X0:X3 and Y0:Y3, where the product voltage can be in a range between GND and a supply voltage $V_{DD}$. A product voltage that is proportional to the binary-weighted product of the input values is further depicted in FIG. 7 and discussed in the associated text. In some embodiments, an IC supply voltage $V_{DD}$ can be within a specified range, for example, between 0.9 V and 1.1 V.

According to embodiments, the analog voltages representing X and Y within 4-bit charge-scaling multiplier 600 are generated, selected and scaled directly, in response to the application of binary input numbers X and Y to the multiplier. The analog voltage generation, scaling and summing does not rely upon the generation of carry signals and associated delay, as depicted and discussed in reference to FIG. 2. Embodiments of the present disclosure can therefore be used to provide more rapid multiplications of binary numbers with circuitry that uses less power and consumes less IC circuit area than traditional binary multiplication circuits.

4-bit charge-scaling multiplier 600 also includes a reference capacitor $C_{REF1}$, having a value of C' that is electrically connected to GND and further electrically connected to scaled node W. According to embodiments, the capacitance value C', can be different than value of C. For example, in some embodiments the value C' can be equal to the value of C multiplied by a scaling factor "S," i.e., C'=S*C. In some embodiments, the scaling factor S can be, for example 16. In some embodiments the scaling factor S can be in a range between 8 and 24. A relatively large scaling factor S, e.g., 24, can result in enhanced precision of an output analog voltage at the PROD output node. A relatively small scaling factor S, e.g., 8, can result in relatively smaller scaling capacitor sizes and reduced IC circuit area consumption. An IC designer can evaluate the trade-offs of various scaling factors and choose a scaling factor according to design constraints such as maximum IC area and a specified analog output voltage precision.

According to embodiments, the input of unity gain amp 610 is electrically connected to local product node $PROD_A$, and the output is electrically connected to the PROD output node. Unity gain amp 610 can be useful for driving the PROD output node to a voltage equivalent to a voltage on the local product node $PROD_A$. Unity gain amp 610 can be particularly useful for isolating and stabilizing the analog product output voltage of the local product node $PROD_A$ from being affected by low impedance or impedance variations of the PROD output node. In embodiments, unity gain amp 610 can be, for example, an operational amplifier or other type of amplifier fabricated within an IC, e.g., 110, FIG. 1.

In embodiments the 4-bit charge-scaling multiplier 600 also includes local reset devices N1 and N2. These local reset devices are electrically connected to GND, and through their output terminals, to the local product node $PROD_A$ and scaled node W, respectively. During operation of the 4-bit charge-scaling multiplier 600, the RESET signal can be asserted, e.g., to a logical "1" state, to activate local reset devices N1 and N2, following the multiplication of two binary numbers. The activation of N1 and N2 can draw the $PROD_A$ node and scaled node W, respectively, to GND. In some embodiments, the reset device can be, for example, NFETs, where an NFET input terminal is understood to be the gate of the NFET, and an NFET output terminal is understood to be the drain of the NFET. In such embodiments, the source terminal of the NFET can be connected to GND.

Resetting the multiplier 600 by drawing the $PROD_A$ node and scaled node W to GND can be useful in preparing the multiplier 600 to receive a subsequent set of input signals representing binary numbers by drawing terminals of the scaled capacitors $C_{Scaled}$ 625 and $C_{Scaled}$ 630 to GND. The return of inputs Y(0:3) to GND following a multiplication operation can similarly draw the MUX0 . . . MUX3 outputs to GND, and thus the other terminals of the scaled capacitors $C_{Scaled}$ 625 to GND. Similarly, the return of inputs X(0:3) to GND following a multiplication operation can similarly draw the other terminals of the scaled capacitors $C_{Scaled}$ 630 to GND.

In some embodiments, the precision of multiplication operations performed with charge-scaling multiplier such as multiplier 600 may be limited by factors previously discussed in reference to 4-bit charge-scaling multiplier 100, FIG. 1.

Embodiments of the present disclosure can also be integrated effectively into computing hardware and systems designed to perform mixed-precision mathematical operations, in which trade-offs are dynamically made by the system between computational speed and computational accuracy. Embodiments can provide such a system with a particularly rapid and energy-efficient alternative to traditional binary computational hardware.

FIG. 7 is a waveform diagram depicting input and output signal waveforms of the example 4-bit charge-scaling multiplier circuits 100, 300, 400, 500 and 600 depicted in FIGS. 1, 3, 4, 5 and 6, respectively, according to embodiments consistent with the figures. The input and output signal waveforms provided in FIG. 7 can provide a visual understanding of causal relationships between logical values of the input signals, i.e., X0 . . . X3, Y0 . . . Y3, RESET, and the PROD node voltage 710 and the product values 705 of the PROD output signal. For example, FIG. 7 depicts several sets of binary number inputs, i.e., the values corresponding to the X0:X3 and Y0:Y3 inputs, and the resulting product values 705 and PROD node voltage 710.

FIG. 7 can also provide an illustration of the relative speed and efficiency of a charge-scaling multiplier circuit, e.g., 100, FIG. 1, relative to various types of binary multiplier circuits, for example, 4-bit×4-bit combinational multiplier structure 200, FIG. 2. Binary multiplier circuits such as combinational multipliers, Wallace tree multipliers, array multipliers and sequential multipliers, depending on architecture, complexity, and the number of bits in the multiplicand and multiplier inputs, can require several logic clock cycles to complete a multiplication operation. Propagation of signals representing carry bits can contribute significantly to the delay of such multipliers. As depicted in FIG. 7, the multiplication of two binary numbers using the charge-scaling multiplier circuits described herein can be completed directly, for example within one or two clock cycles, following the application of the two binary numbers, which can amount to a significant time savings with respect to other types of binary multiplier circuits. It is contemplated that particular embodiments of the present disclosure may complete binary number multiplications approximately 5× faster than comparable binary multiplier circuits.

The vertical axis of FIG. 7 includes labels corresponding to charge-scaling multiplier input and output signals. Progressing from the top of the vertical axis downwards, labels appear for each of the input signals X0, X1, X2, X3, Y0, Y1, Y2, Y3 and RESET, along with corresponding labels for logical 0 and logical 1 states for each input signal. In accordance with voltages used to represent logic states within an integrated circuit, it can be understood that an input signal logical 1 state corresponds to an input voltage equivalent to an IC supply voltage, e.g., $V_{DD}$. Similarly, it can be understood that an input signal logical 0 state corresponds to an input voltage equal to 0.0 V or GND.

Below the input signal labels are labels for the PROD node voltage 710, ranging from 0 V GND to $V_{MAX}$, and for corresponding product values 705 ranging from 0 to 225. In some embodiments, e.g., 4-bit charge-scaling multiplier 300, $V_{MAX}$ can be equal to $V_{DD}/4$. In some embodiments, e.g., 4-bit charge-scaling multipliers 400, 500 and 600, $V_{MAX}$ can be equal to $V_{DD}$. Product values 705 correspond to the product of the values of the two binary number inputs at particular points in time. Product values 705 each proportionally correspond to a PROD voltage 710 that ranges between GND and $V_{MAX}$. For example, the PROD node output value of 255 corresponds to a PROD voltage 710 approaching or adjacent to $V_{MAX}$, while the PROD node output value of 0 corresponds to a PROD voltage 710 of 0 V. According to embodiments, offsets in the PROD voltage 710 between each two adjacent product values 705 are uniform. For example, if the PROD voltage 710 offset between product values 705 of 0 and 1 is 4 mV, then the PROD voltage 710 offset between product values 705 of 1 and 2 is also 4 mV. The voltage offsets between adjacent product values 705 may vary slightly due to effects of various IC process parameter variations such as scaling capacitor size differences and dimensional tolerances.

The horizontal axis at the bottom of FIG. 7 corresponds to a unitless sequence of times at which sets of input signals representing binary numbers are applied to the X0:X3 and Y0:Y3 inputs of the charge-scaling multiplier. In some embodiments, the time interval between each labeled unitless time can be, for example, approximately 10 ps, in accordance with circuitry delays and performance characteristics of a particular IC technology.

Following the application of each of these sequential sets of binary number input signals, the RESET signal is actively asserted to a logical "1" in order to reset the charge-scaling multiplier circuit in preparation for the next set of binary number input signals. The assertion of the RESET signal, in conjunction with the return of each of the X0:X3 and Y0:Y3 input signals to a logical "0" state, or 0 V, is useful to draw the terminals of the scaled capacitors included within a 4-bit charge-scaling multiplier to 0 V, in order to prepare the multiplier to receive and evaluate a subsequent set of binary number inputs.

At time 1, for example, binary number values of 13 and 12 are applied to the X0:X3 and Y0:Y3 inputs, respectively, and in response, the product value 705 transitions to the value of 156, representing the product of the binary numbers, i.e., the value of X(0:3) multiplied by the value of Y(0:3). The inputs then return to a logical "0" state, and the RESET signal is subsequently asserted, resulting in the multiplier being reset and the product value 705 transitioning to a value of 0. At time 2, binary number values of 1 and 4 are applied to the X(0:3) and Y(0:3) inputs, respectively, and in response, the product value 705 transitions to a value of 4. The RESET signal is again asserted, resulting in the multiplier being reset and the product value 705 transitioning to the value of 0. This alternating sequence of multiplying two binary numbers and subsequently resetting the multiplier circuit continues through time 17. As depicted, the product value 705 can, depending on the values of X and Y at particular points in time, have a range of positive values or can be 0.

Figure 8:
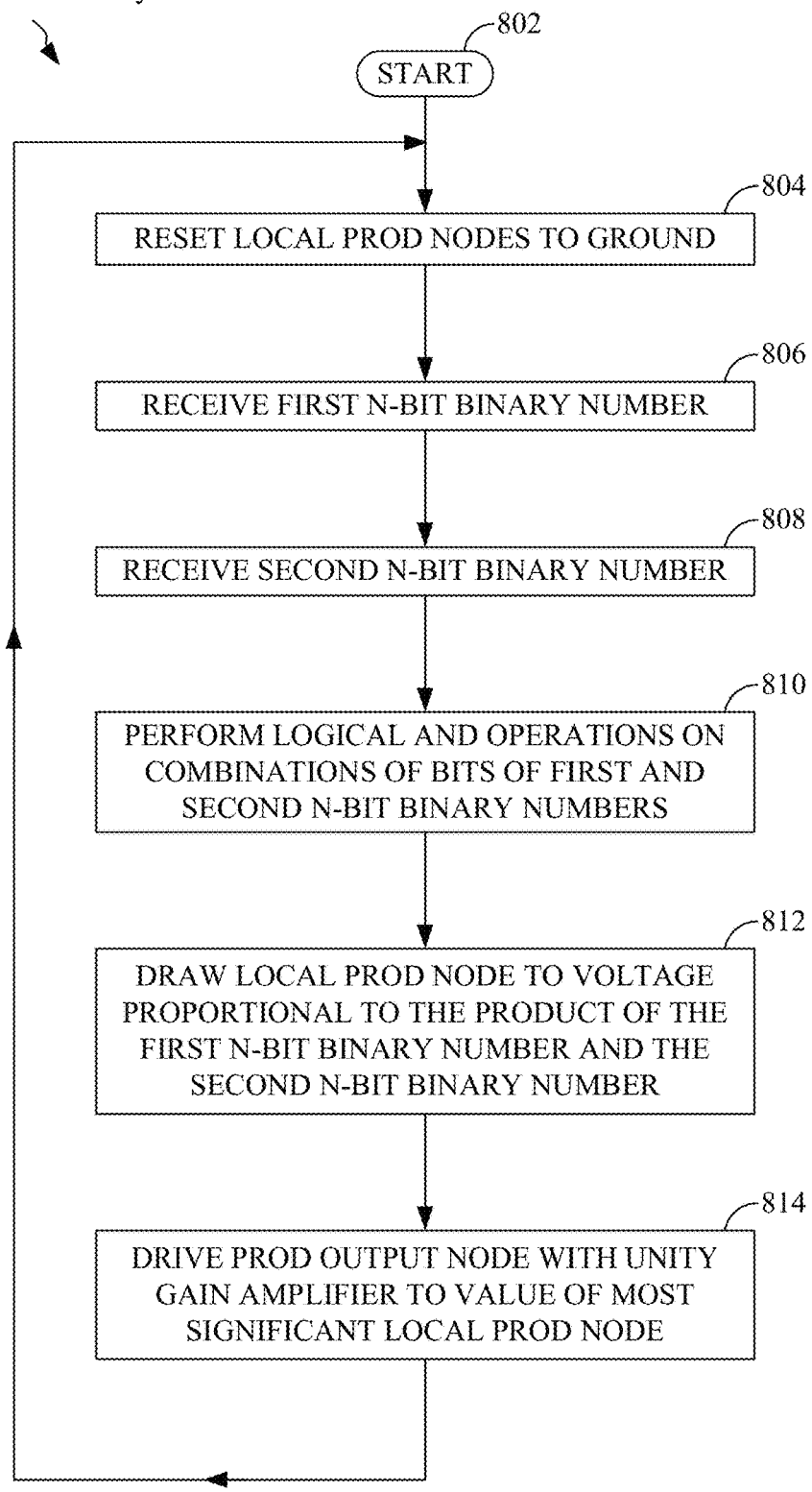
FIG. 8 is a flow diagram depicting a method for operating a charge-scaling multiplier circuit to multiply two N-bit binary numbers, according to embodiments consistent with the figures.

FIG. 8 is a flow diagram depicting a method 800 for operating a charge-scaling multiplier circuit, fabricated within an IC, to multiply two N-bit binary numbers, according to embodiments consistent with the figures. The execution of method 800 can provide, through the use of a charge-scaling multiplier circuit, rapid multiplication of binary numbers. When used with a charge-scaling multiplier fabricated within an IC, method 800 can also provide for substantial increases in computing system throughput through the use of limited-precision or mixed-precision multiplication operations. Such increases in computing system throughput can result in overall increases in computing system performance and benefit to computing system end-users. The method depicted and described with reference to FIG. 8 is generally consistent with the 4-bit charge-scaling multiplier 300 depicted and described with reference to FIG. 3.

The method 800 moves from start 802 to operation 804. Operation 804 generally refers to resetting the charge-scaling multiplier circuit. According to embodiments, the multiplier circuit can be reset by drawing to GND, with reset devices, e.g., N1 and N2, FIG. 3, of the multiplier circuit, at least one local product node, e.g., $PROD_A$ and $PROD_B$, FIG. 3. According to embodiments, the reset devices can include a transistor such as an NFET which can drive a local product node to GND in response to receiving a RESET signal. As a result of the most-significant local product node being drawn to GND, the PROD output node will also be driven to GND by the unity gain amplifier 310, FIG. 3. According to embodiments, a voltage on the PROD output node represents the product of the values of two binary numbers received by the multiplier circuit. Drawing the PROD output node to GND can be useful in creating an initial product of 0, prior to the charge-scaling multiplier circuit receiving a set of two binary numbers. In embodiments of the charge-scaling multiplier circuit that include one or more sections each having a local product node, operation 804 can also include drawing, with a set of local reset devices, each of the one or more local product nodes to GND in response to the multiplier circuit receiving the RESET signal. Once the multiplier circuit is reset, the method 800 moves to operation 806.

Operation 806 generally refers to the multiplier circuit receiving a first N-bit binary number. In embodiments, a section of digital logic, e.g., 104, FIG. 1, within the IC 110, FIG. 1, can be electrically connected to the multiplier circuit and configured to provide the first N-bit binary number to the multiplier circuit. According to embodiments, the first N-bit binary number is received at a first set of N inputs of the multiplier circuit, which are electrically connected to a set of AND gates, e.g., G1, FIG. 3, within the multiplier circuit. Once the first N-bit binary number has been received, the method 800 moves to operation 808.

Operation 808 generally refers to the multiplier circuit receiving a second N-bit binary number. In embodiments, a section of digital logic, e.g., 104, FIG. 1, within the IC 110, FIG. 1, can be electrically connected to the multiplier circuit and configured to provide the second N-bit binary number to the multiplier circuit. According to embodiments, the second N-bit binary number is received at a second set of N inputs of the multiplier circuit, which are electrically connected to the set of AND gates, e.g., G1, FIG. 3, within the multiplier circuit. According to embodiments, the second N-bit binary number can be received at the same time as the first N-bit binary number or at a time different from when the first N-bit binary number is received. Once the second N-bit binary number has been received, the method 800 moves to operation 810.

Operation 810 generally refers to performing logical AND operations on combinations of bits of the first and second N-bit binary numbers. According to embodiments, a logical AND operation is performed for each unique pair of bits, where one bit is from the first N-bit binary number, and another bit is from the second N-bit binary number. These logical AND operations are used to generate a set of product terms for the two N-bit binary numbers. In embodiments, the outputs of AND gates used for these operations are electrically connected to a set of scaled capacitors, e.g., scaled capacitors $C_{Scaled}$ 325, FIG. 3 that are also electrically connected to one or more local product nodes, e.g., $PROD_A$ and $PROD_B$, FIG. 3, within the multiplier. Once the logical AND operations have been performed, the method 800 moves to operation 812.

Operation 812 generally refers to drawing an MS local product node, e.g., $PROD_A$, FIG. 3, of the multiplier circuit to a voltage proportional to a product of the first and the second N-bit binary numbers. In embodiments, switching of outputs of the AND gates used for the logical AND operations is used, in conjunction with the set of scaled capacitors and a reference capacitor, to generate a voltage on the MS local product node that is proportional to the product of the first and second N-bit binary numbers. The set of scaled capacitors, in conjunction with the reference capacitor and possibly an attenuation capacitor, is used as a capacitive voltage-divider circuit. Once the local product node has been drawn to the voltage representing the product of the binary numbers, the method 800 moves to operation 814.

Operation 814 generally refers to driving the PROD output node with a unity gain amplifier, e.g., 310, FIG. 3, to the voltage of the MS local product node. In embodiments, the unity gain amplifier can be an operational amplifier or other type of amplifier fabricated within IC 110, FIG. 1. The unity gain amplifier can be useful in isolating the MS local product output node from low impedance or impedance variations on the PROD output node which may adversely affect the accuracy of the voltage on the MS local product node which represents the product of the two N-bit binary numbers. In some embodiments, driving the PROD output node of the multiplier circuit to the voltage proportional to the product of the first and second N-bit binary numbers can be followed by converting, with an ADC within the IC, the voltage to a binary number representing the product of the first and second N-bit binary numbers. Once the PROD output node has been driven to the voltage of the local product node, the method 800 returns to operation 804.

Figure 9:
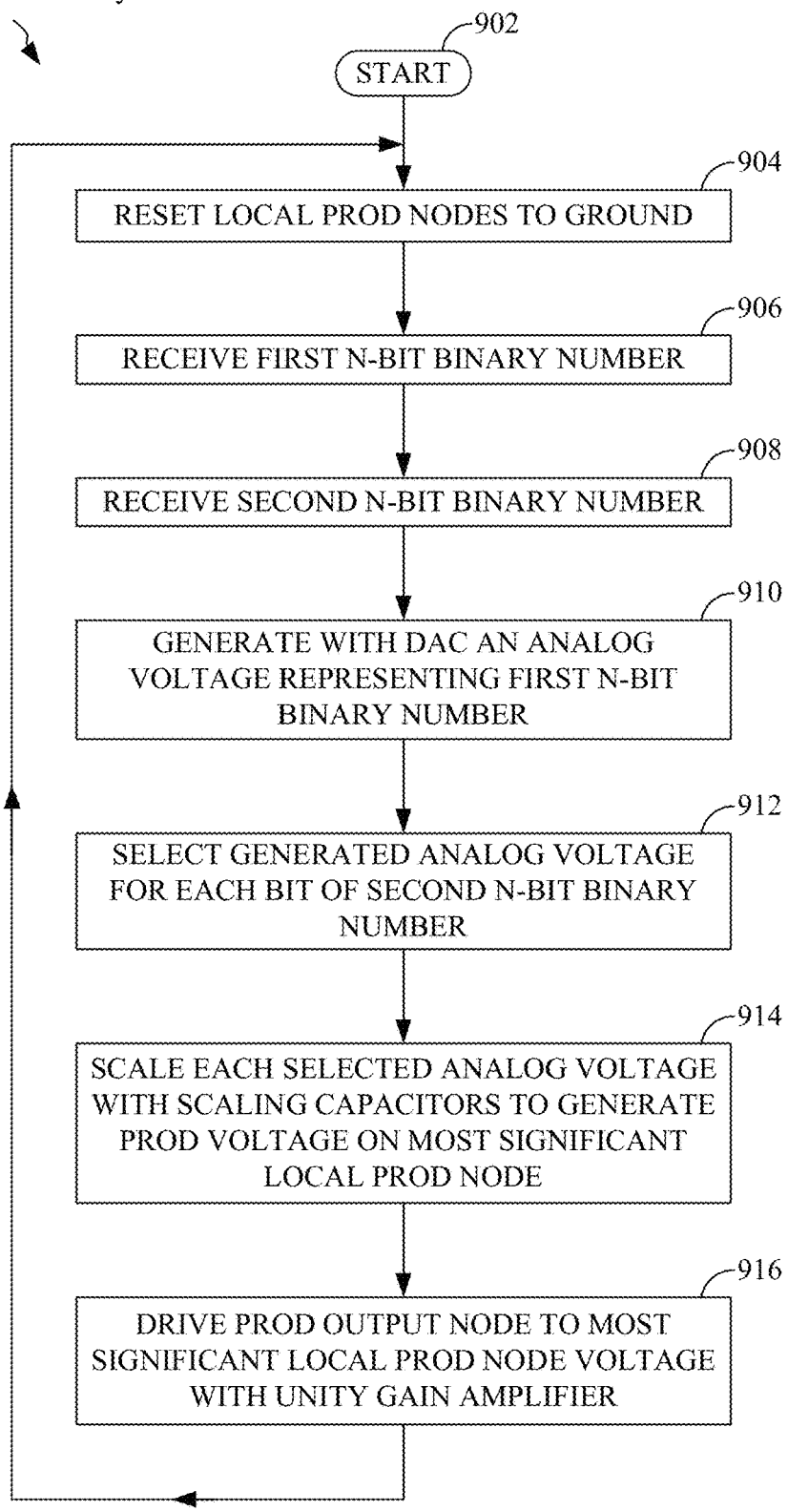
FIG. 9 is a flow diagram depicting a method for operating a charge-scaling multiplier circuit to multiply two N-bit binary numbers, according to embodiments consistent with the figures.

FIG. 9 is a flow diagram depicting a method 900 for operating a charge-scaling multiplier circuit, fabricated within an IC, to multiply two N-bit binary numbers, according to embodiments consistent with the figures. The execution of method 900 can provide, through the use of a charge-scaling multiplier circuit including a DAC, rapid multiplication of binary numbers. When used with a charge-scaling multiplier fabricated within an IC, method 900 can also provide for substantial increases in computing system throughput through the use of limited-precision or mixed-precision multiplication operations. Such increases in computing system throughput can result in overall increases in computing system performance and benefit to computing system end-users. The method depicted and described with reference to FIG. 9 is generally consistent with the 4-bit charge-scaling multipliers 400 and 500 depicted and described with reference to FIGS. 4 and 5, respectively.

The method 900 moves from start 902 to operation 904. Operation 904 generally refers to resetting the charge-scaling multiplier circuit. According to embodiments, the multiplier circuit can be reset by drawing to GND, with a reset device of the multiplier circuit, e.g., N1, FIG. 4, a local product node, e.g., $PROD_A$, FIG. 4. According to embodiments, the reset devices can include a transistor such as an NFET which can drive a local product node to GND in response to receiving a RESET signal. As a result of the local product node being drawn to GND, the PROD output node will also be driven to GND by the unity gain amplifier. According to embodiments, a voltage on the PROD output node represents the product of the values of two binary numbers received by the multiplier circuit. Drawing the PROD output node to GND can be useful in creating an initial product of 0, prior to the charge-scaling multiplier circuit receiving a set of two binary numbers. In embodiments of the charge-scaling multiplier circuit that include one or more sections each having a local product node, operation 904 can also include drawing, with a set of local reset devices, each of the one or more local product nodes to GND in response to the multiplier circuit receiving the RESET signal. In some embodiments one of the local product nodes may be located within a digital DAC. Once the multiplier circuit is reset, the method 900 moves to operation 906.

Operation 906 generally refers to the multiplier circuit receiving a first N-bit binary number. In embodiments, a section of digital logic, e.g., 104, FIG. 1, within the IC 110, FIG. 1, can be electrically connected to the multiplier circuit and configured to provide the first N-bit binary number to the multiplier circuit. According to embodiments, the first N-bit binary number is received at a first set of N inputs of the multiplier circuit, which are electrically connected to a DAC, e.g., 420 FIG. 4, within the multiplier circuit. In some embodiments, the first set of N inputs can be electrically connected to a set of scaled capacitors, e.g., 530, FIG. 5, within the DAC, and in some embodiments the first set of N inputs can be electrically connected to a first set of mux select inputs within the DAC. Once the first N-bit binary number has been received, the method 900 moves to operation 908.

Operation 908 generally refers to the multiplier circuit receiving a second N-bit binary number. In embodiments, a section of digital logic, e.g., 104, FIG. 1, within the IC 110, FIG. 1, can be electrically connected to the multiplier circuit and configured to provide the second N-bit binary number to the multiplier circuit. According to embodiments, the second N-bit binary number is received at a second set of N inputs of the multiplier circuit, which are electrically connected to a second set of mux select inputs, e.g., of muxes MUX0 . . . MUX3, FIG. 4, within the multiplier circuit. According to embodiments, the second N-bit binary number can be received at the same time as the first N-bit binary number or at a time different from when the first N-bit binary number is received. Once the second N-bit binary number has been received, the method 900 moves to operation 910.

Operation 910 generally refers to generating, with the DAC, an analog DAC output voltage representing the first N-bit binary number. In some embodiments the generating includes driving a DAC output node, e.g., Z, FIG. 4, to the analog DAC output voltage through the use of a voltage divider circuit in conjunction with an analog mux. The analog mux is used to select, in response to the value of the first N-bit binary number, one analog voltage of a plurality of analog voltages provided to the analog mux by the voltage divider circuit. According to embodiments, the plurality of analog voltages provided to the analog mux can be evenly distributed in a range between and including $V_{DD}$ and GND. In some embodiments, a set of scaled capacitors connected to the bits of the first N-bit binary number X can be used in conjunction with a unity gain amplifier to generate a voltage representing the first N-bit binary number X. Once the analog DAC output voltage representing the first N-bit binary number has been generated, the method 900 moves to operation 912.

Operation 912 generally refers to selecting the analog DAC output voltage representing the first N-bit binary number to be applied to scaling capacitors. According to embodiments, the analog DAC output voltage representing the first N-bit binary number is selected in accordance with a respective input of the second set of N inputs applied to a select input of each analog mux of a set of N analog muxes, e.g., MUX0 . . . MUX3, FIG. 4. The output of each analog mux is electrically interconnected to a scaling capacitor that is also interconnected to a local product node. The selection of the DAC analog voltage or alternately, of a GND connection with each analog mux can be useful for causing the voltage on the local product node to correspond to a scaled version of the product of the analog DAC output voltage, according to embodiments. Once the analog DAC output voltage has been selected, the method 900 moves to operation 914.

Operation 914 generally refers to scaling each selected analog voltage to generate a product voltage. In embodiments, the scaled capacitors are used to scale the DAC output voltage selected by each of the set of analog muxes to produce an output voltage on the local product node that represents a product of the first N-bit binary number and the second N-bit binary number. The scaled capacitors, e.g., 425, FIG. 4, electrically connected to the output of each mux of the set of analog muxes are assigned capacitance values proportional to the significance of each respective associated bit of the second N-bit binary number. The proportioned scaled capacitor values in conjunction with the analog voltage output selected by each analog mux allows the output voltage on the local output node to accurately represent a product of the first and second N-bit binary numbers. Once each selected analog voltage has been scaled, the method 900 moves to operation 916.

Operation 916 generally refers to driving the PROD output node with a unity gain amplifier to the voltage of the local product node. In embodiments, the unity gain amplifier, e.g., 410, FIG. 4, can be an operational amplifier or other type of amplifier fabricated within IC 110, FIG. 1. The unity gain amplifier can be useful in isolating the local product output node from low impedance or impedance variations on the PROD output node which may adversely affect the accuracy of the voltage on the MS local product node which represents the product of the two N-bit binary numbers. In some embodiments, driving the PROD output node of the multiplier circuit to the voltage proportional to the product of the first and second N-bit binary numbers can be followed by converting, with an ADC within the IC, the voltage to a binary number representing the product of the first and second N-bit binary numbers. Once the PROD output node has been driven to the voltage of the local product node, the method 900 returns to operation 904.

Figure 10:
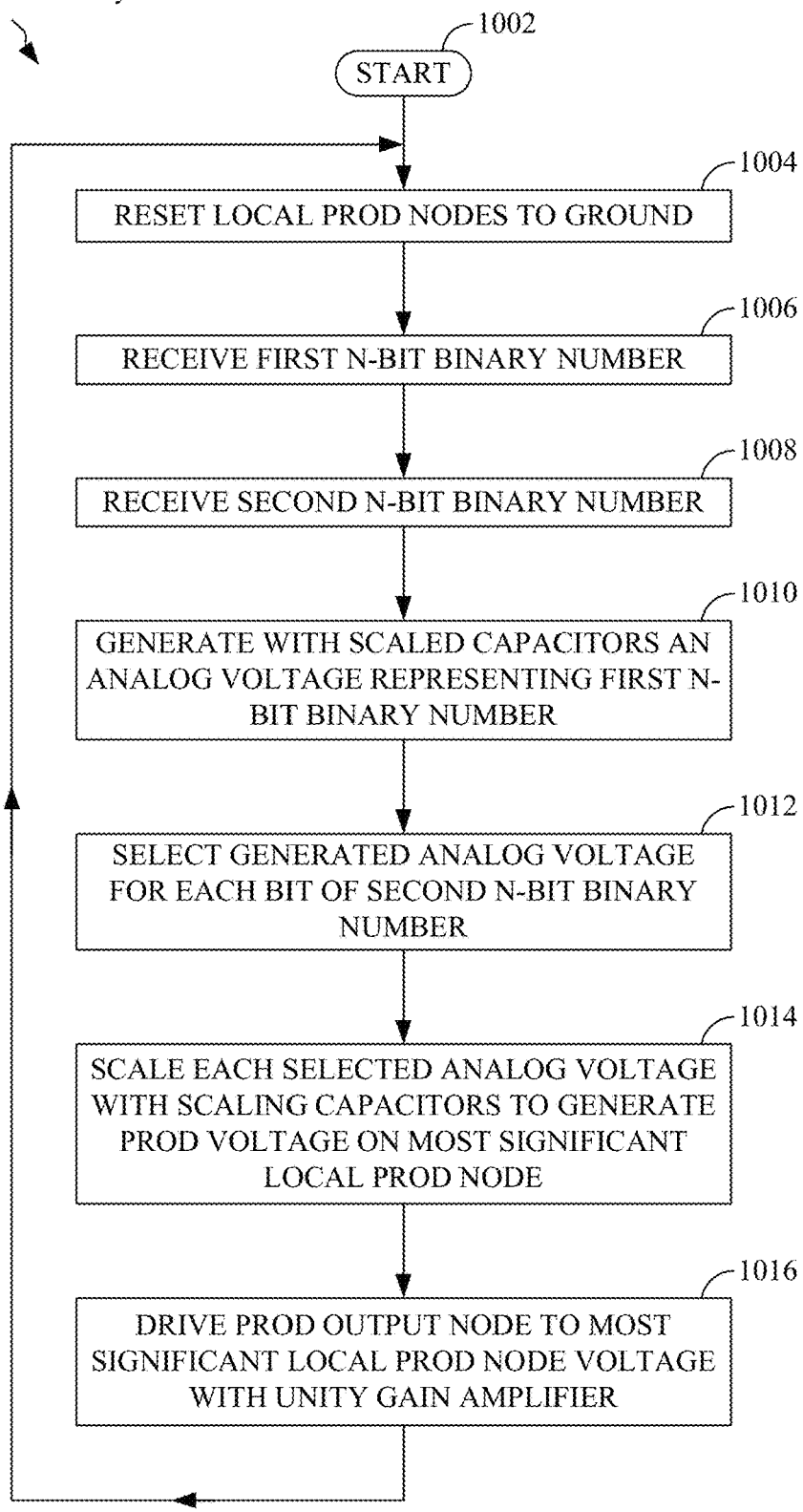
FIG. 10 is a flow diagram depicting a method for operating a charge-scaling multiplier circuit to multiply two N-bit binary numbers, according to embodiments consistent with the figures.

FIG. 10 is a flow diagram depicting a method 1000 for operating a charge-scaling multiplier circuit, fabricated within an IC, to multiply two N-bit binary numbers, according to embodiments consistent with the figures. The execution of method 1000 can provide, through the use of a charge-scaling multiplier circuit including two sets of scaled capacitors, rapid multiplication of binary numbers. When used with a charge-scaling multiplier fabricated within an IC, method 1000 can also provide for substantial increases in computing system throughput through the use of limited-precision or mixed-precision multiplication operations. Such increases in computing system throughput can result in overall increases in computing system performance and benefit to computing system end-users. The method depicted and described with reference to FIG. 10 is generally consistent with the 4-bit charge-scaling multiplier 600 depicted and described with reference to FIG. 6.

The method 1000 moves from start 1002 to operation 1004. Operation 1004 generally refers to resetting the charge-scaling multiplier circuit. According to embodiments, the multiplier circuit can be reset by drawing to GND, with a reset device of the multiplier circuit, e.g., N1, FIG. 6, a local product node and a scaled node. According to embodiments, the reset devices can include a transistor such as an NFET which can drive the local product node and the scaled node to GND in response to receiving a RESET signal. As a result of the local product node, e.g., $PROD_A$, FIG. 6, being drawn to GND, the PROD output node will also be driven to GND by the unity gain amplifier. According to embodiments, a voltage on the PROD output node represents the product of the values of two binary numbers received by the multiplier circuit. Drawing the PROD output node to GND can be useful in creating an initial product of 0, prior to the charge-scaling multiplier circuit receiving a set of two binary numbers. Once the multiplier circuit is reset, the method 1000 moves to operation 1006.

Operation 1006 generally refers to the multiplier circuit receiving a first N-bit binary number. In embodiments, a section of digital logic, e.g., 104, FIG. 1, within the IC 110, FIG. 1, can be electrically connected to the multiplier circuit and configured to provide the first N-bit binary number to the multiplier circuit. According to embodiments, the first N-bit binary number is received at a first set of N inputs of the multiplier circuit, which are electrically connected to a first set of scaling capacitors, e.g., 630, FIG. 6, within the multiplier circuit. Once the first N-bit binary number has been received, the method 1000 moves to operation 1008.

Operation 1008 generally refers to the multiplier circuit receiving a second N-bit binary number. In embodiments, a section of digital logic, e.g., 104, FIG. 1, within the IC 110, FIG. 1, can be electrically connected to the multiplier circuit and configured to provide the second N-bit binary number to the multiplier circuit. According to embodiments, the second N-bit binary number is received at a second set of N inputs of the multiplier circuit, which are electrically connected to a set of mux select inputs, e.g., of muxes MUX0 . . . MUX3, FIG. 6, within the multiplier circuit. According to embodiments, the second N-bit binary number can be received at the same time as the first N-bit binary number or at a time different from when the first N-bit binary number is received. Once the second N-bit binary number has been received, the method 1000 moves to operation 1010.

Operation 1010 generally refers to generating, with the first set of scaled capacitors, e.g., 630, FIG. 6, a scaled voltage on a scaled node (see scaled node W, FIG. 6) that represents the first N-bit binary number. According to embodiments, the first set of scaled capacitors is electrically connected to the first set of N inputs of the multiplier circuit and to the scaled node. In embodiments, capacitance values of the first set of scaled capacitors are assigned in proportion to the significance of the bits. The receiving of the first N-bit binary number at the first set of N inputs causes the first set of scaled capacitors to act as a capacitive voltage divider circuit, which generates, on the scaled node, an analog voltage representing, i.e., in proportion to, the first N-bit binary number. Once the scaled voltage representing the first N-bit binary number has been generated, the method 1000 moves to operation 1012.

Operation 1012 generally refers to selecting the analog voltage on the scaled node, e.g., W, FIG. 6, representing the first N-bit binary number, to be applied to a second set of scaling capacitors. According to embodiments, the scaled node voltage representing the first N-bit binary number is selected in accordance with a respective input of the second set of N inputs applied to a select input of each analog mux of a set of N analog muxes, e.g., MUX0 . . . MUX3, FIG. 6. The output of each analog mux is electrically interconnected to a scaling capacitor of a second set of scaling capacitors that is also interconnected to a local product node. The selection of the scaled node voltage or alternately, of a GND connection with each analog mux can be useful for causing the voltage on the local product node to correspond to a scaled version of the scaled node voltage, according to embodiments. Once the analog DAC output voltage has been selected, the method 1000 moves to operation 1014.

Operation 1014 generally refers to scaling each selected analog voltage to generate a product voltage. In embodiments, the second set of scaling capacitors, e.g., 625, FIG. 6, are used to scale the scaled node voltage selected by each of the set of analog muxes to produce an output voltage on the local product node that represents a product of the first N-bit binary number and the second N-bit binary number. The second set of scaling capacitors electrically connected to the output of each mux of the set of analog muxes are assigned capacitance values proportional to the significance of each respective associated bit of the second N-bit binary number. The proportioned scaled capacitor values in conjunction with the analog voltage output driven by each analog mux allows the output voltage on the local output node to accurately represent a product of the first and second N-bit binary numbers. Once each selected analog voltage has been scaled, the method 1000 moves to operation 1016.

Operation 1016 generally refers to driving the PROD output node with a unity gain amplifier, e.g., 610, FIG. 6, to the voltage of the local product node. In embodiments, the unity gain amplifier can be an operational amplifier or other type of amplifier fabricated within IC 110, FIG. 1. The unity gain amplifier can be useful in isolating the local product output node from low impedance or impedance variations on the PROD output node which may adversely affect the accuracy of the voltage on the MS local product node which represents the product of the two N-bit binary numbers. In some embodiments, driving the PROD output node of the multiplier circuit to the voltage proportional to the product of the first and second N-bit binary numbers can be followed by converting, with an ADC within the IC, the voltage to a binary number representing the product of the first and second N-bit binary numbers. Once the PROD output node has been driven to the voltage of the local product node, the method 1000 returns to operation 1004.

Figure 11:
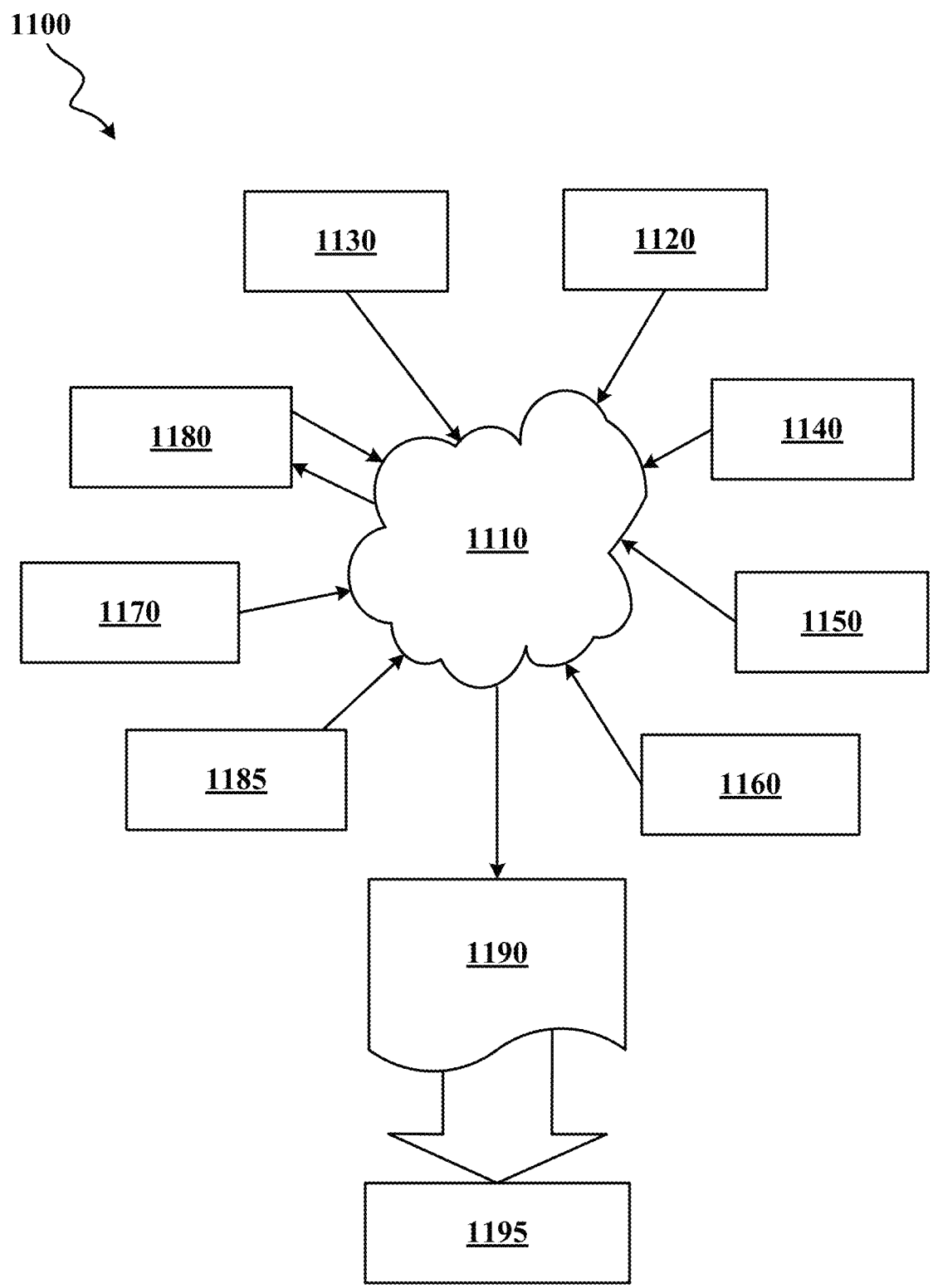
FIG. 11 illustrates multiple design structures including an input design structure that is preferably processed by a design process, according to embodiments consistent with the figures.

FIG. 11 depicts multiple design structures 1100 including an input design structure 1120 that is preferably processed by a design process, according to embodiments consistent with the figures. Input design structure 1120 may be a logical simulation design structure generated and processed by design process 1110 to produce a logically equivalent functional representation of a hardware device. Input design structure 1120 may alternatively include data or program instructions that, when processed by design process 1110, generate a functional representation of the physical structure of a hardware device. Whether representing functional or structural design features, input design structure 1120 may be generated using electronic computer-aided design, such as that implemented by a core developer/designer. When encoded on a machine-readable or computer-readable data transmission, gate array, or storage medium, input design structure 1120 may be accessed and processed by one or more hardware or software modules within design process 1110 to simulate or otherwise functionally represent an electronic component, circuit, electronic or logic module, apparatus, device, or system such as those depicted in FIG. 1 and FIG. 3. As such, input design structure 1120 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 1110 preferably employs and incorporates hardware or software modules for synthesizing, translating, or otherwise processing a design/simulation functional equivalent of the components, circuits, devices, or logic structures depicted in FIG. 1 and FIG. 3, to generate a Netlist 1160 which may contain design structures such as input design structure 1120. Netlist 1160 may comprise, for example, compiled or otherwise processed data structures representing a list of wires, discrete components, logic gates, control circuits, I/O devices, models, etc. that describe the connections to other elements and circuits in an integrated circuit design. Netlist 1160 may be synthesized using an iterative process in which Netlist 1160 is resynthesized one or more times depending on design specifications and parameters for the device. As with other design structure types described herein, Netlist 1160 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 1110 may include hardware and software modules for processing a variety of input data structure types including Netlist 1160. Such data structure types may reside, for example, within library elements 1130 and include a set of commonly used elements, circuits, and devices, including models, layouts, and symbolic representations, for a given manufacturing technology (e.g., different technology nodes, 22 nm, 14 nm, 10 nm, 7 nm, etc.). The data structure types may further include design specifications 1140, characterization data 1150, verification data 1180, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110, without deviating from the scope and spirit of the disclosure. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process input design structure 1120 together with some or all of the depicted supporting data structures, along with any additional mechanical design or data, to generate a second design structure 1190. Second design structure 1190 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to input design structure 1120, second design structure 1190 preferably comprises one or more files, data structures, or other computer-encoded data or instructions that reside on transmission or data storage media and that, when processed by an ECAD system, generate a logically or otherwise functionally equivalent form of one or more of the embodiments of the disclosure depicted in FIG. 1 and FIG. 3. In one embodiment, second design structure 1190 may comprise a compiled, executable HDL simulation model that functionally simulates the devices depicted in FIG. 1 and FIG. 3.

Second design structure 1190 may also employ a data format used for the exchange of layout data of integrated circuits and/or symbolic data format (e.g., information stored in a GDSII, GL1, OASIS, map files, or any other suitable format for storing such design data structures). Second design structure 1190 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and depicted in FIG. 1 and FIG. 3. Second design structure 1190 may then proceed to a state 1195 where, for example, second design structure 1190 proceeds to tape-out, is released to manufacturing, is released to a mask house, is sent to another design house, is sent back to the customer, etc.

What is claimed is:

1. A multiplier circuit fabricated within an integrated circuit (IC), the multiplier circuit configured to draw a product output node to a voltage proportional to a product of two received N-bit binary numbers, the multiplier circuit comprising:
a first set of N inputs configured to receive a first N-bit binary number, each input of the first set of N inputs indexed by an integer bit number "n" corresponding to each input's respective significance, where n is in a range between and including 0 and N−1;
a second set of N inputs configured to receive a second N-bit binary number, each input of the second set of N inputs indexed by the integer bit number "n" corresponding to each input's respective significance;
a local reset device configured to draw, in response to receiving a reset signal, a local product node to ground;
a first set of N scaled capacitors, each capacitor of the first set of N scaled capacitors electrically connected to a respective input of the first set of N inputs, and further electrically connected to a scaled node, each capacitor of the first set of N scaled capacitors having a capacitance value equal to $2^n *$a unit capacitance value ($C_{UNIT}$);
a first reference capacitor electrically connected to GND and further electrically connected to the scaled node, a value of the reference capacitor equal to $C_{UNIT}$;
a set of N analog muxes, each analog mux of the set of N analog muxes configured to drive, in response to a respective input of the second set of N inputs, to a corresponding analog mux output node, a voltage equivalent to a voltage on the scaled node;
a second set of N scaled capacitors, each capacitor of the second set of N scaled capacitors electrically connected to a respective analog mux output node and further electrically connected to the local product node, each capacitor of the second set of N scaled capacitors having a capacitance value equal to $2^n *C_{UNIT}$;
a second reference capacitor electrically connected to GND and further electrically connected to the local product node, a value of the reference capacitor equal to $C_{UNIT}$; and
a unity gain amplifier configured to drive the product output node to a voltage equivalent to a voltage on the local product node.

2. The multiplier circuit of claim 1, wherein a voltage of the product output node is in a range between ground (GND) and a supply voltage (Vdd).

3. The multiplier circuit of claim 1, wherein the local reset device is an N-channel field-effect transistor (NFET).

4. The multiplier circuit of claim 1, wherein an IC technology is selected from the group consisting of: complementary metal-oxide semiconductor (CMOS) and silicon on insulator (SOI).

5. The multiplier circuit of claim 1, wherein the multiplier circuit receives binary numbers from digital logic circuits within the IC and outputs an analog voltage representing the product of the binary numbers to an analog-to-digital converter (ADC) within the IC.

6. The multiplier circuit of claim 5, wherein the ADC is selected from the group consisting of: a flash ADC, a resistor ladder ADC, a parallel comparator ADC, a successive-approximation ADC, and a counter type ADC.

7. The multiplier circuit of claim 1, wherein the scaled capacitors and the reference capacitor are selected from the group consisting of: Metal-Insulator-Metal (MIM) capacitors, metal-oxide semiconductor (MOS) capacitors, and trench capacitors.

8. The multiplier circuit of claim 1, wherein a supply voltage of the multiplier circuit is in a range between 0.9 V and 1.1 V.

9. The multiplier circuit of claim 1, wherein a smallest voltage increment of the voltage, proportional to a product of the received N-bit binary numbers, at the product output node, is greater than an operating voltage of an analog-to-digital converter (ADC) divided by 250.

10. The multiplier circuit of claim 1, wherein the voltage proportional to a product of received N-bit binary numbers is within a voltage range corresponding to +/−1 least significant bit (LSB) of the received N-bit binary numbers.

11. The multiplier circuit of claim 1, wherein a value of $C_{UNIT}$ is in a range between 2× and 10× an input capacitance of an analog-to-digital converter (ADC) connected to the product output node.

12. A method of operating a multiplier circuit that uses charge-scaling to multiply a first N-bit binary number by a second N-bit binary number, the multiplier circuit fabricated within an integrated circuit (IC), the method comprising:
resetting the multiplier circuit by drawing to ground, with a local reset device of the multiplier circuit, a local product node of the multiplier circuit;
receiving, with a first set of N inputs of the multiplier circuit, a first N-bit binary number;
receiving, with a second set of N inputs of the multiplier circuit, a second N-bit binary number;
generating, with a first set of scaling capacitors and in response to a value of first N-bit binary number, at a scaled node, a scaled voltage that represents the value of the first N-bit binary number;
selecting, in accordance with a respective input of the second set of N inputs applied to each analog mux of a set of N analog muxes, the scaled voltage to be applied to respective scaling capacitors of a second set of scaling capacitors electrically connected to respective analog mux output nodes;
scaling, with the respective scaling capacitors of the second set of scaling capacitors, the scaled voltage to produce, on the local product node of the multiplier circuit, a product output voltage representing a product of the first N-bit binary number and the N-bit second binary number; and
driving, with a unity gain amplifier electrically connected to the local product node, a product output node to the product output voltage.

13. The method of claim 12, further comprising converting to a binary number representing the product of the first and second N-bit binary numbers, with an analog-to-digital converter (ADC) within the IC, the product output voltage to a binary number representing the product of the first and second N-bit binary numbers.

14. The method of claim 12, wherein a smallest voltage increment of the voltage, proportional to a product of the first and second N-bit binary numbers, at the product output node, is greater than an operating voltage of an analog-to-digital converter (ADC) divided by 250.

15. The method of claim 12, wherein a supply voltage of the multiplier circuit is in a range between 0.9 V and 1.1 V.

16. A design structure embodied on a non-transitory computer-readable storage medium readable by a machine used in design, manufacture, and simulation of an integrated circuit (IC) multiplier circuit, the design structure comprising elements that, when processed in a semiconductor manufacturing facility, produce an IC comprising:
a multiplier circuit fabricated within an integrated circuit (IC), the multiplier circuit configured to draw a product output node to a voltage proportional to a product of two received N-bit binary numbers, the multiplier circuit including:
a first set of N inputs configured to receive a first N-bit binary number, each input of the first set of N inputs indexed by an integer bit number "n" corresponding to each input's respective significance, where n is in a range between and including 0 and N−1;
a second set of N inputs configured to receive a second N-bit binary number, each input of the second set of N inputs indexed by the integer bit number "n" corresponding to each input's respective significance;
a local reset device configured to draw, in response to receiving a reset signal, a local product node to ground;
a first set of N scaled capacitors, each capacitor of the first set of N scaled capacitors electrically connected to a respective input of the first set of N inputs, and further electrically connected to a scaled node, each capacitor of the first set of N scaled capacitors having a capacitance value equal to $2^n$*a unit capacitance value ($C_{UNIT}$); and
a first reference capacitor electrically connected to GND and further electrically connected to the scaled node, a value of the reference capacitor equal to $C_{UNIT}$; and
a set of N analog muxes, each analog mux of the set of N analog muxes configured to drive, in response to a respective input of the second set of N inputs, to a corresponding analog mux output node, a voltage equivalent to a voltage on the scaled node;
a second set of N scaled capacitors, each capacitor of the second set of N scaled capacitors electrically connected to a respective analog mux output node and further electrically connected to the local product node, each capacitor of the second set of N scaled capacitors having a capacitance value equal to $2^n*C_{UNIT}$;
a second reference capacitor electrically connected to GND and further electrically connected to the local product node, a value of the reference capacitor equal to $C_{UNIT}$; and
a unity gain amplifier configured to drive the product output node to a voltage equivalent to a voltage on the local product node.

17. The design structure of claim 16, wherein a technology of the IC is selected from the group consisting of: complementary metal-oxide semiconductor (CMOS) and silicon on insulator (SOI).

18. The design structure of claim 16, wherein the multiplier circuit receives binary numbers from digital logic circuits within the IC and outputs an analog voltage representing the product of the binary numbers to an analog-to-digital converter (ADC) within the IC.

19. The design structure of claim 18, wherein the ADC is selected from the group consisting of: a flash ADC, a resistor ladder ADC, a parallel comparator ADC, a successive-approximation ADC, and a counter type ADC.

20. The design structure of claim 16, wherein the scaled capacitors and the reference capacitor of the multiplier circuit are selected from the group consisting of: Metal-Insulator-Metal (MIM) capacitors, metal-oxide semiconductor (MOS) capacitors, and trench capacitors.

\* \* \* \* \*